(12) United States Patent
Benoit et al.

(10) Patent No.: US 7,510,817 B2
(45) Date of Patent: Mar. 31, 2009

(54) PHOTORESIST POLYMER COMPOSITIONS

(75) Inventors: Didier Benoit, San Jose, CA (US); Adam Safir, Berkeley, CA (US); Han-Ting Chang, Livermore, CA (US); Dominique Charmot, Campbell, CA (US); Isao Nishimura, Mie (JP); Akimasa Soyano, Mie (JP); Kenji Okamoto, Mie (JP); Yong Wang, Mie (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/300,657

(22) Filed: Dec. 12, 2005

(65) Prior Publication Data

US 2006/0257781 A1    Nov. 16, 2006

Related U.S. Application Data

(63) Continuation of application No. PCT/US2004/020351, filed on Jun. 25, 2004.

(60) Provisional application No. 60/483,310, filed on Jun. 26, 2003.

(51) Int. Cl.
*G03F 7/00* (2006.01)
*G03F 7/004* (2006.01)

(52) U.S. Cl. .................................. 430/270.1

(58) Field of Classification Search .............. 430/270.1
See application file for complete search history.

(56) References Cited

U.S. PATENT DOCUMENTS

| | | | |
|---|---|---|---|
| 5,314,962 A | 5/1994 | Otsu et al. | |
| 5,489,654 A | 2/1996 | Clouet | |
| 5,658,986 A | 8/1997 | Clouet | |
| 5,866,047 A | 2/1999 | Nagino et al. | |
| 5,929,271 A | 7/1999 | Hada et al. | |
| 5,962,184 A | 10/1999 | Allen et al. | |
| 6,013,416 A | 1/2000 | Nozaki et al. | |
| 6,048,666 A | 4/2000 | Niwa et al. | |
| 6,087,063 A | 7/2000 | Hada et al. | |
| 6,140,010 A | 10/2000 | Iwasa et al. | |
| 6,153,705 A | 11/2000 | Corpart et al. | |
| 6,190,833 B1 | 2/2001 | Shiota et al. | |
| 6,207,342 B1 | 3/2001 | Takechi et al. | |
| 6,280,911 B1 | 8/2001 | Trefonas, III | |
| 6,303,266 B1 | 10/2001 | Okino et al. | |
| 6,303,268 B1 | 10/2001 | Namba et al. | |
| 6,380,335 B1 * | 4/2002 | Charmot et al. ............. 526/220 |
| 6,391,529 B2 | 5/2002 | Maeda et al. | |
| 6,395,850 B1 | 5/2002 | Charmot et al. | |
| 6,423,463 B1 | 7/2002 | Oota et al. | |
| 6,440,636 B1 | 8/2002 | Ushirogouchi | |
| 6,465,150 B1 | 10/2002 | Numata et al. | |
| 6,468,712 B1 | 10/2002 | Fedynyshyn | |
| 6,479,210 B2 | 11/2002 | Kinoshita et al. | |
| 6,492,086 B1 | 12/2002 | Barclay et al. | |
| 6,512,021 B1 | 1/2003 | Sugiki et al. | |
| 6,512,081 B1 | 1/2003 | Rizzardo et al. | |
| 6,517,990 B1 | 2/2003 | Choi et al. | |
| 6,517,991 B1 | 2/2003 | Kodama et al. | |
| 6,517,993 B2 | 2/2003 | Nakamura et al. | |
| 6,517,994 B2 | 2/2003 | Watanabe | |
| 6,518,364 B2 | 2/2003 | Charmot et al. | |
| 6,544,715 B2 | 4/2003 | Sato et al. | |
| 6,548,221 B2 | 4/2003 | Uetani et al. | |
| 6,559,337 B2 | 5/2003 | Maeda et al. | |
| 6,569,971 B2 | 5/2003 | Roh et al. | |
| 6,596,458 B1 | 7/2003 | Sato et al. | |
| 6,787,282 B2 * | 9/2004 | Sato ........................... 430/170 |
| 6,962,961 B2 * | 11/2005 | Lai ............................ 526/222 |
| 2001/0044070 A1 | 11/2001 | Uetani et al. | |
| 2003/0044718 A1 * | 3/2003 | Kodama et al. .......... 430/270.1 |
| 2003/0180662 A1 | 9/2003 | Nakano | |
| 2003/0232938 A1 | 12/2003 | Charmot | |
| 2004/0248031 A1 * | 12/2004 | Ansai et al. .............. 430/270.1 |

FOREIGN PATENT DOCUMENTS

| | | |
|---|---|---|
| EP | 0 349 232 | 1/1990 |
| EP | 0 421 149 | 4/1991 |
| EP | 0 449 619 | 10/1991 |
| EP | 1 182 506 | 2/2002 |
| JP | 2-27660 | 1/1990 |
| JP | 3-42618 | 2/1991 |
| JP | 4-226461 | 8/1992 |

(Continued)

OTHER PUBLICATIONS

Author: Otsu et al. Publish date: Publish Year:1998 vol. 136 pp. 75-137 Journal: Advanced in Polymer Science Title: Controlled Synthesis Of Polymer Using The Iniferter Technique: Developments In Living Radical Polymerization.

Author: Castro et al. Publish Date: Publish Year:1984 vol. 49 pp. 863-866 Journal: J. Org Chem. Title: Kinetics And Mechanism Of The Addition Of Amines To Carbon Disulfide In Ethanol.

Author: Corkan et al. Publish Date: Publish Year:1992 vol. 17 pp. 47-74 Journal: Chemometrics and Intelligent Lab. Sys. Title: Experiment Manager Software for an Automated Chemistry Workstation, Including a Scheduler for Parallel Experimentation.

(Continued)

Primary Examiner—Amanda C. Walke
(74) Attorney, Agent, or Firm—Scott D. Rothenberger; Fulbright & Jaworski LLP

(57) ABSTRACT

The present invention is directed to the preparation of photoresist polymers via living free radical polymerization techniques. Sterically bulky ester monomers are utilized as the polymerization components. Use of chain transfer agents is included in polymerization processing conditions. Cleavage of polymer terminal end groups that include a heteroatom are described.

21 Claims, No Drawings

FOREIGN PATENT DOCUMENTS

| | | |
|---|---|---|
| JP | 5-188598 | 7/1993 |
| JP | 7-221235 | 8/1995 |
| JP | 7-234511 | 9/1995 |
| JP | 2002-296783 | 10/2002 |
| JP | 2003-084436 | 3/2003 |
| WO | WO 98/01478 | 1/1998 |
| WO | WO 98/58974 | 12/1998 |
| WO | WO 99/05099 | 2/1999 |
| WO | WO 99/31144 | 6/1999 |
| WO | WO 99/35171 | 7/1999 |
| WO | WO 99/35177 | 7/1999 |
| WO | WO 99/51980 | 10/1999 |
| WO | WO 00/75207 | 12/2000 |
| WO | WO 01/95034 A1 | 12/2001 |
| WO | WO 02/090397 | 11/2002 |
| WO | WO 02/090409 | 11/2002 |
| WO | WO 02/090424 A1 | 11/2002 |
| WO | WO 2005/003198 | 1/2005 |

OTHER PUBLICATIONS

*Author*: Thayer *Publish Date: Publish Year*:2000 vol. 78(6) pp. 19-32 *Journal*: Business *Title*: Bioinformatics For The Masses.

*Author*: McFarland *Publish Date: Publish Year*:1998 vol. 13.3 pp. 107-120 *Journal*: Matrice Technologies Ltd. *Title*: Approaches For Rapid Materials Discovery Using Combinatorial Methods.

*Author*: Cargill et al. *Publish Date: Publish Year*:1996 vol. 8 pp. 139-148 *Journal*: LRA *Title*: Automated Combinatorial Chemistry on Solid Phase.

*Author*: Grigoriadls et al. *Publish Date: Publish Year*:1997 vol. April pp. 53-54 *Journal*: Application Note *Title*: A Relational System for Managing High-Throughput Screening Data.

\* cited by examiner

PHOTORESIST POLYMER COMPOSITIONS

CROSS-REFERENCE TO RELATED APPLICATION

This application is a continuation application of International Application No. PCT/US2004/020351, filed 25 Jun. 2004 and published as WO 2005/003198 A1 on 13 Jan. 2005, which claims priority to U.S. Provisional Patent Application Ser. No. 60/483,310 filed Jun. 26, 2003, and claims the priority thereof, the subject matter of which is hereby incorporated by reference in its entirety.

BACKGROUND OF THE INVENTION

In the field of microfabrication represented by the manufacture of integrated circuit devices, lithographic technology enabling microfabrication with a line width of 0.20 μm or less has been demanded in order to increase the degree of integration.

A conventional lithographic process utilizes near ultraviolet rays such as an i-line radiation. However, it is very difficult to perform microfabrication with a line width of sub-quarter micron using near ultraviolet rays.

Therefore, in order to enable microfabrication with a line width of 0.20 μm or less, utilization of radiation with a shorter wavelength has been studied. Deep ultraviolet rays represented by a bright line spectrum of a mercury lamp and an excimer laser, X-rays, electron beams, and the like can be given as radiation with a shorter wavelength. Of these, a KrF excimer laser (wavelength: 248 nm) and an ArF excimer laser (wavelength: 193 nm) have attracted attention.

As a resist applicable to the excimer laser radiation, a number of resists utilizing a chemical amplification effect between a component having an acid-dissociable functional group and a component generating an acid (hereinafter referred to as "photoacid generator") which generates an acid upon irradiation (hereinafter referred to as "exposure") have been proposed. Such a resist is hereinafter called a chemically-amplified resist.

Japanese Patent Publication No. 2-27660 discloses a chemically-amplified resist containing a polymer having a t-butyl ester group of a carboxylic acid or t-butyl carbonate group of a phenol and a photoacid generator. The t-butyl ester group or t-butyl carbonate group in the polymer dissociates by the action of an acid generated upon exposure, whereby the polymer has an acidic group such as a carboxylic group or a phenolic hydroxyl group. As a result, exposed areas of the resist film become readily soluble in an alkaline developer.

Generally, conventional KrF chemically-amplified resists contain a phenol resin as a base resin. However, phenol resins are not adequate to be used in ArF photoresists due to their strong absorption of ArF laser rays by aromatic rings, such that a sufficient amount of ArF laser rays does not effectively reach a lower portion of the resist film so that the irradiation dose is increased in the upper portion of the resist film and decreased in the lower portion. As a result, the resist pattern after development is trapezoidol resulting in a resist pattern that is thinner in the upper portion and thicker in the lower portion. Sufficient resolution is generally not obtained. If the resist pattern after development is in the shape of a trapezoid, desired dimensional accuracy cannot be achieved in a succeeding step such as an etching step or ion implantation step. Moreover, if the shape of the upper part of the resist pattern is not rectangular, the rate of removal of the resist by dry etching is increased, whereby it is difficult to control etching conditions.

The shape of the resist pattern can be improved by increasing the radiation transmittance of the resist film. For example, a (meth)acrylate resin, e.g., a polymethylmethacrylate, is a highly desirable resin from the viewpoint of radiation transmittance, because the (meth)acrylate resin has high transparency to deep ultraviolet rays. Japanese Patent Application Laid-open No. 4-226461 discloses a chemically-amplified resist using a methacrylate resin, for example. However, this composition has insufficient dry etching resistance due to the absence of an aromatic ring, although the composition performs well in microfabrication performance. This makes it difficult to perform etching with high accuracy. Therefore, a composition having both transparency to radiation and dry etching resistance is not provided in this manner.

As a means to improve dry etching resistance of a chemically-amplified resist, without impairing transparency to radiation, a method of introducing an aliphatic ring into the resin component in the resist polymer instead of an aromatic ring has been studied. For example, Japanese Patent Application Laid-open No. 7-234511 discloses a chemically-amplified resist using a (meth)acrylate resin having an aliphatic ring.

To further improve ArF photoresist performance, one or more recurring unit(s) has been introduced to the above described resins. For example, Japanese Patent 3042618 discloses a chemically-amplified resist using a resin by incorporating a recurring unit having a lactone skeleton. Japanese Patent Application Laid-open No. 2002-296783A discloses a chemically-amplified resist using a resin by incorporating recurring unit rather than described above.

However, the (meth)acrylate based photoresist resin discussed so far are prepared by conventional free radical polymerization processes. As the monomers therein are quite different in both molecular size and polarity for their chemical structures, copolymerization of them by conventional free radical polymerization generates several disadvantages in the molecular characterizations of the resin: (1) wide polydispersion (2) monomer drift between polymer chains (3) difficulty in control of polymerization reproductivity.

Therefore, a need exists for polymeric resins which overcome one or more of the above-identified drawbacks of currently available photoresist polymeric resins.

BRIEF SUMMARY OF THE INVENTION

In one aspect, the present invention pertains to a photoresist composition comprising: (B) a photo-acid generator and, (A) a polymeric resin having the formula

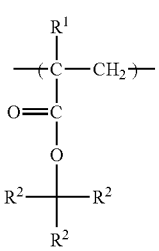

(1)

wherein $R^1$ represents a hydrogen atom or a methyl group, each $R^2$, individually, represents a linear or branched, non-substituted or substituted, alkyl group having 1-4 carbon atoms or a bridged or non-bridged, non-substituted or substituted, monovalent alicyclic hydrocarbon group having 4-20 carbon atoms, provided that at least one $R^2$ group is a linear or branched alkyl group having 1-4 carbon atoms, or any two $R^2$ groups form, in combination and together with the carbon atoms to which the two $R^2$ groups bond, a bridged or non-bridged, non-substituted or substituted, divalent alicyclic hydrocarbon group having 4-20 carbon atoms, with the remaining $R^2$ groups being a linear or branched, non-substituted or substituted, alkyl group having 1-4 carbon atoms or —C(R$_2$)$_3$, is one of

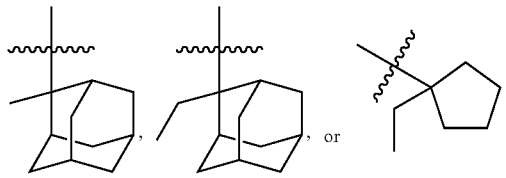

such that the

indicates that the bond carbon bond is directly attached to the ester oxygen; and wherein the polymer is prepared by a living free radical process in the presence of a chain transfer agent (CTA) having the formula

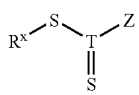

wherein $R^x$ is a group that is sufficiently labile to be expelled as its free radical form, T is carbon or phosphorus, and Z is any group that activates the C=S double bond towards a reversible free radical addition fragmentation reaction.

In certain embodiments, Z is selected from the group consisting of hydrocarbyl, substituted hydrocarbyl, heteroatom-containing hydrocarbyl, substituted heteroatom-containing hydrocarbyl, and combinations thereof.

In other embodiments, Z is selected from the group consisting of hydrogen, optionally substituted alkyl, optionally substituted aryl, optionally substituted alkenyl, optionally substituted acyl, optionally substituted, aroyl, optionally substituted alkoxy, optionally substituted heteroaryl, optionally substituted heterocyclyl, optionally substituted alkylsulfonyl, optionally substituted alkylsulfinyl, optionally substituted alkylphosphonyl, optionally substituted arylsulfinyl, and optionally substituted arylphosphonyl.

In a further aspect, the polymeric resins of the photoresist polymer compositions can further include at least a second recurring unit having selected from the group consisting of (2)

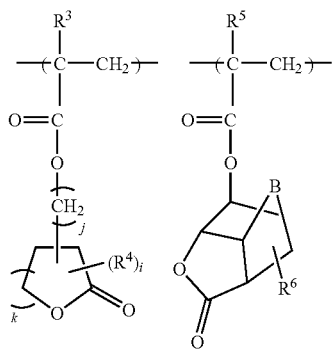

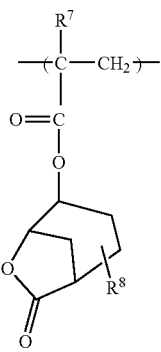

wherein $R^3$ represents a hydrogen atom or a methyl group, $R^4$ is a linear or branched alkyl group having 1-6 carbon atoms or a linear or branched alkyl group having 1-6 carbon atoms substituted with one or more alkyloxy, alkylcarbonyloxy or oxo groups, two or more $R^4$ groups, if present, being either the same or different, i is an integer of 0–(3+k), j is 0 or 1, k is an integer of 1-3, $R^5$ represents a hydrogen atom or a methyl group, B is a methylene group, an oxygen atom, or a sulfur atom, $R^6$ represents a hydrogen atom, a linear or branched alkyl group having 1-6 carbon atoms, or a linear or branched alkyl group having 1-6 carbon atoms substituted with one or more alkyloxy, alkylcarbonyloxy or oxo groups, $R^7$ represents a hydrogen atom or a methyl group, and $R^8$ represents a hydrogen atom, a linear or branched alkyl group having 1-6 carbon atoms, or a linear or branched alkyl group having 1-6 carbon atoms substituted with one or more alkyloxy, alkylcarbonyloxy or oxo groups.

The polymeric resins of the photoresist composition can further include at least one additional recurring unit having the formula

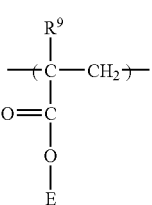

wherein where E represents a group derived from non-bridged or bridged, non-substituted or substituted alicyclic hydrocarbons and $R^9$ is a hydrogen atom, trifluoromethyl or a methyl group.

The polymeric resins of the photoresist composition generally have a molecular weight of between about 2,000 and about 30,000. Additionally, the polymeric resins generally have a polydispersity is less than or equal to about 1.5. Lastly, the polymeric resins that are prepared by the methods of the invention generally include a CTA fragment that can be cleaved by methods disclosed throughout the specification.

In another aspect, the present invention pertains to a photoresist composition comprising a photo-acid generator and a polymeric resin having the formula $[A]_x[B]_y[C]_z$ (I)

wherein A, B and C are each individually one of

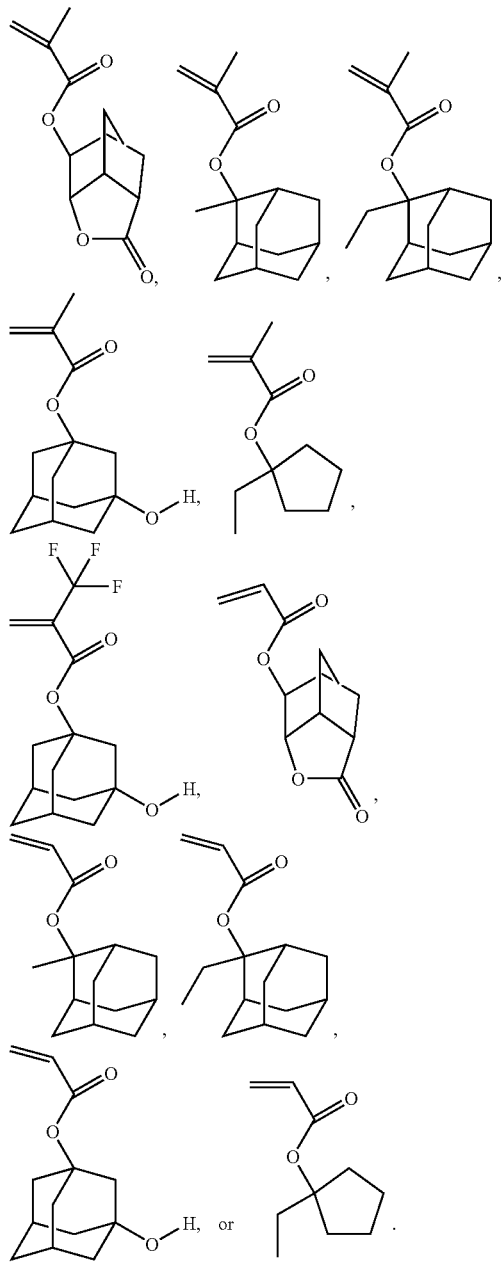

More particularly, "x" is between about 0 and about 200 inclusive, "y" is between about 1 and about 200 inclusive and "z" is between about 1 and about 200 inclusive. In general, the polymers of the invention are random copolymers and can be prepared in a batch process or under semi-continuous polymerization reaction conditions.

In certain aspects of the polymers of the invention, x has a value of at least 1.

In other aspects of the invention, the polymers of the photoresist compositions have a polydispersity index of less than about 1.7 and more specifically are between about 1.2 and about 1.4. Molecular weights ($M_w$) of the polymers of the invention have a range of from between about 2,000 to about 30,000.

In one embodiment, A, B and C, each individually, are selected from

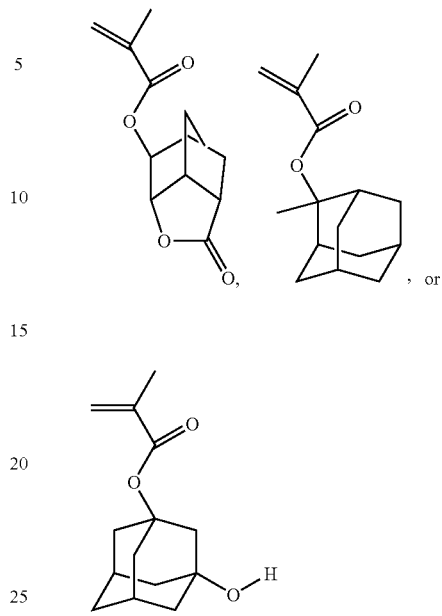

and x is at least one (1). In a specific embodiment, A, B and C are each different (A≠B≠C). For instance, an exemplary polymer prepared with three different methacrylic monomers (A, B and C) is (II)

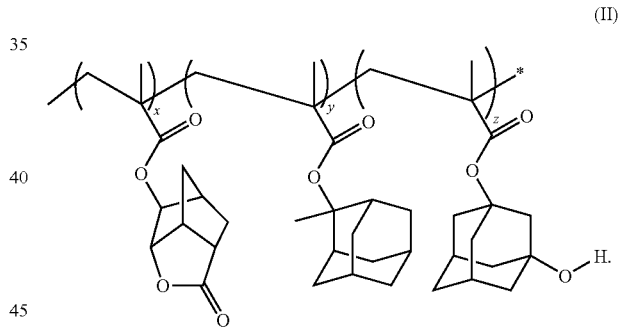

It should be understood by one skilled in the art, that in the polymeric formula $[A]_x[B]_y[C]_z$, monomeric subunits of A, B and C have been polymerized through their respective unsaturated olefinic portions into a resultant polymeric resin.

In another embodiment, A, B and C, each individually, are selected from

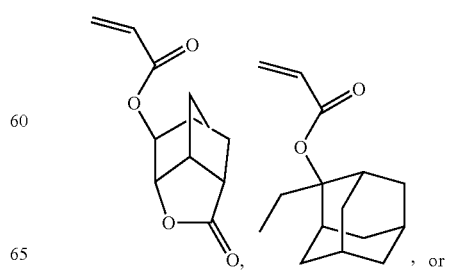

-continued

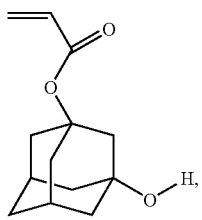

where x is at least one (1). For example, a polymer prepared from three different acrylic monomers (A, B and C) can be represented by the polymeric resin as (III)

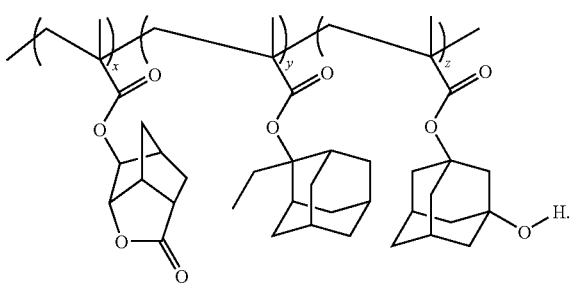

In still another embodiment, A, B and C, each individually, are selected from

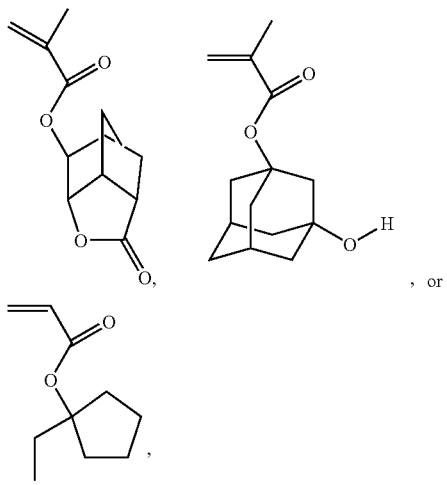

, or where x is at least one (1). For example, a polymer prepared from three different acrylic monomers (A, B and C) can be represented by the polymeric resin as (IV)

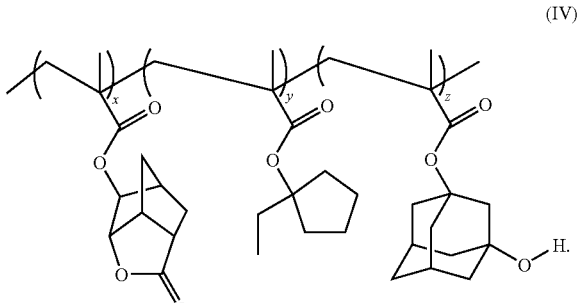

Therefore, both acrylic and methacrylic type esters, and mixtures thereof, having sterically bulky ester groups have been prepared and are encompassed by the present invention and are useful, for example, in coatings applications, e.g., photoresist materials.

In certain aspects of the invention, the polymeric resin of the photoresist composition is insoluble or sparingly soluble in alkali but becomes alkali soluble by the action of an acid.

In other aspects of the invention, the terminal end position of the polymeric resin (acrylic or methacrylic derivatives) of the photoresist composition includes a thiocarbonylthio moiety. The thiocarbonylthio moiety can be also be subjected to cleavage conditions so that in one embodiment, the terminal end position of the polymer includes a termination group having the formula

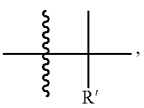

wherein R' is CN or COOMe. Alternatively, the terminal position can be capped by a hydrogen atom, a monomeric unit or with a RAFT group depending upon the conditions selected.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION

High absorption at 193 or 157 nm limits the light penetration into the resist and does not allow for complete resist exposure at the bottom of the resist. Without complete resist exposure, the resist cannot image properly. If the resist is made thin enough to ensure full exposure, it may not be sufficiently thick to withstand subsequent processing steps such as plasma etching or ion implantation. To compensate for this problem, resist designers often resort to multilayer resists in which a sufficient thin resist is deposited on top of a second resist that is more photoreactive. While these composite resists are effective, resolution is compromised by the undercutting or widening of the exposed areas during development. The present invention provides materials and methods to produce single or multilayer thin resists that are sufficiently thin so as to permit light to penetrate to the bottom of the resist while also being sufficiently thick enough to withstand etching and/or other post exposure processing steps. Conventional aqueous developers can be used to remove the exposed base soluble polymer after exposure to the radiant energy source.

The ability to form a photolithographic pattern is defined by Rayleigh's equation in which R represents a resolution or line width of an optical system.

Rayleigh's equation is:

$$R = k\lambda/NA$$

wherein $\lambda$ represents a wavelength of an exposure light, NA is a numerical aperture of a lens, and k is a process factor. It should be understood from the Rayleigh equation that a wavelength $\lambda$ of an exposure light must decrease in value in order to accomplish a higher resolution or obtain a smaller R.

For example, it is well known that a high pressure mercury vapor lamp emits a defined band of radiation (the "i-line") at a wavelength of 365 nm. Mercury vapor lamps have been used as a light source for manufacturing a dynamic random access memory (DRAM) having an integration equal to or smaller than 64M bits. Similarly, the KrF excimer laser emitting radiant energy at a wavelength of 248 nm is commonly used in a mass production of 256 bit DRAM devices. This manufacturing process requires a processing dimension smaller than 0.25 microns. Even shorter wavelengths are required for the manufacturing of DRAMs having an integration higher than 1 G bits. Such devices will require a processing dimension smaller than 0.2 microns. For this purpose, other excimer lasers such as the KrCl laser having a wavelength of 222 nm, the ArF laser having a wavelength of 193 nm and, the $F_2$ laser having a wavelength of 157 nm, are currently being investigated.

In one aspect, the present invention provides photoresist compositions comprising a photo-acid generator and a polymeric resin having the formula

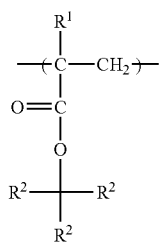

(1)

wherein $R^1$ represents a hydrogen atom or a methyl group, each $R^2$, individually, represents a linear or branched, non-substituted or substituted, alkyl group having 1-4 carbon atoms or a bridged or non-bridged, non-substituted or substituted, monovalent alicyclic hydrocarbon group having 4-20 carbon atoms, provided that at least one $R^2$ group is a linear or branched alkyl group having 1-4 carbon atoms, or any two $R^2$ groups form, in combination and together with the carbon atoms to which the two $R^2$ groups bond, a bridged or non-bridged, non-substituted or substituted, divalent alicyclic hydrocarbon group having 4-20 carbon atoms, with the remaining $R^2$ groups being a linear or branched, non-substituted or substituted, alkyl group having 1-4 carbon atoms or —$C(R_2)_3$, is one of

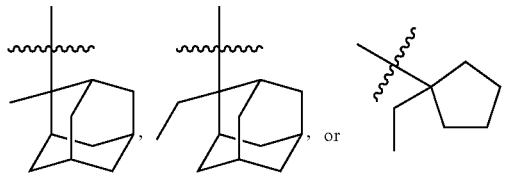

such that the

indicates that the bond carbon bond is directly attached to the ester oxygen; and wherein the polymer is prepared by a living free radical process in the presence of a chain transfer agent (CTA) having the formula

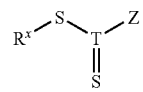

wherein $R^x$ is a group that is sufficiently labile to be expelled as its free radical form, T is carbon or phosphorus, and Z is any group that activates the C=S double bond towards a reversible free radical addition fragmentation reaction.

In certain embodiments, Z is selected from the group consisting of hydrocarbyl, substituted hydrocarbyl, heteroatom-containing hydrocarbyl, substituted heteroatom-containing hydrocarbyl, and combinations thereof.

In other embodiments, Z is selected from the group consisting of hydrogen, optionally substituted alkyl, optionally substituted aryl, optionally substituted alkenyl, optionally substituted acyl, optionally substituted, aroyl, optionally substituted alkoxy, optionally substituted heteroaryl, optionally substituted heterocyclyl, optionally substituted alkylsulfonyl, optionally substituted alkylsulfinyl, optionally substituted alkylphosphonyl, optionally substituted arylsulfinyl, and optionally substituted arylphosphonyl.

In a further aspect, the photoresist compositions comprise a photo-acid generator and polymeric resins that can further include at least a second recurring unit having the formula

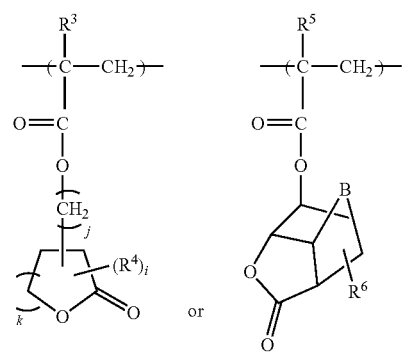

(3)

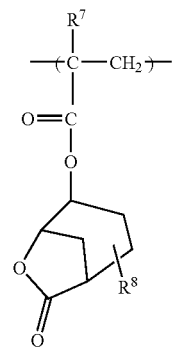

wherein $R^3$ represents a hydrogen atom or a methyl group, $R^4$ is a linear or branched alkyl group having 1-6 carbon atoms or a linear or branched alkyl group having 1-6 carbon atoms substituted with one or more alkyloxy, alkylcarbonyloxy or oxo groups, two or more $R^4$ groups, if present, being either the same or different, i is an integer of 0–(3+k), j is 0 or 1, k is an integer of 1-3, $R^5$ represents a hydrogen atom or a methyl group, B is a methylene group, an oxygen atom, or a sulfur atom, $R^6$ represents a hydrogen atom, a linear or branched alkyl group having 1-6 carbon atoms, or a linear or branched alkyl group having 1-6 carbon atoms substituted with one or more alkyloxy, alkylcarbonyloxy or oxo groups, $R^7$ represents a hydrogen atom or a methyl group, and $R^8$ represents a hydrogen atom, a linear or branched alkyl group having 1-6 carbon atoms, or a linear or branched alkyl group having 1-6 carbon atoms substituted with one or more alkyloxy, alkylcarbonyloxy or oxo groups.

The polymeric resins of the photoresist compositions can further include at least one additional recurring unit having the formula

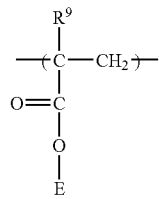
(4)

wherein where E represents a group derived from non-bridged or bridged, non-substituted or substituted alicyclic hydrocarbons and $R^9$ is a hydrogen atom, trifluoromethyl or a methyl group.

The polymeric resins of the photoresist composition generally have a molecular weight of between about 2,000 and about 30,000. Additionally, the polymeric resins generally have a polydispersity is less than or equal to about 1.5. Lastly, the polymeric resins that are prepared by the methods of the invention generally include a CTA fragment that can be cleaved by methods disclosed throughout the specification.

It should be understood that combinations of all monomers (and monomeric units derived from polymers presented herein) are within the scope of the invention.

In one aspect of the photoresist composition, the polymeric resin is insoluble or scarcely soluble in alkali but becomes alkali soluble by action of an acid. The polymeric resin having the general formula (1), as described above, is prepared by LFRP in the presence of a CTA, as described throughout the specification. This polymeric resin is hereinafter referred to as "polymeric resin (A)".

The term "insoluble or scarcely soluble in alkali" used herein refers to characteristics in which 50% or more of the initial film thickness remains after development in the case of developing a resist film consisting only of the resin (A) of the photoresist composition under alkaline development conditions employed when forming a resist pattern using a resist film formed of the radiation-sensitive resin composition comprising the resin (A) of the photoresist composition.

The polymeric resin (A) of the photoresist composition can include one or more additional recurring monomeric units described throughout the specification. For example, these recurring units include those noted above as those having formula (3) as described above. The polymeric resin (A) of the photoresist composition can also include recurring units having the formula (4) as described above.

As specific examples of the group shown by $—C(R^2)_3$ in the recurring unit (1), a t-butyl group and groups of the following formulas, or substituted versions thereof.

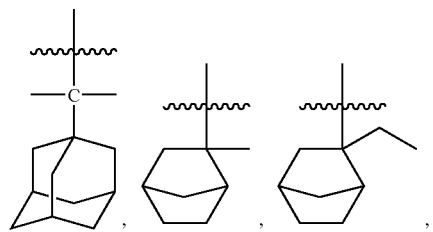

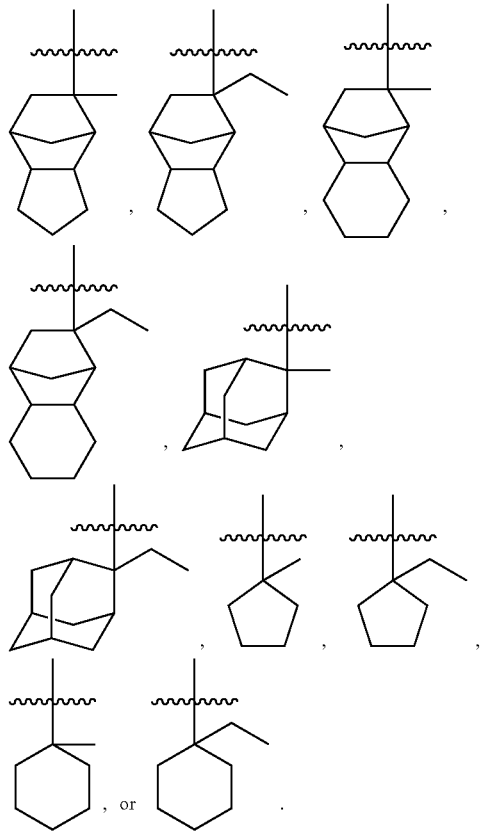

It should be understood that the above identified $—C(R^2)_3$ groups can be present either individually or in combination with one or more additional monomers within polymeric resin (A) of the photoresist composition.

Specific example of recurring units having formula (3) include

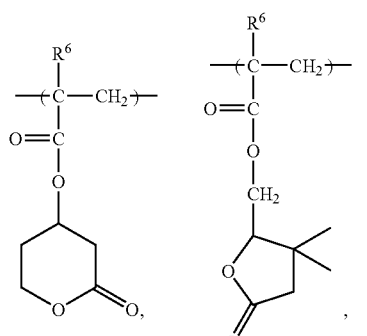

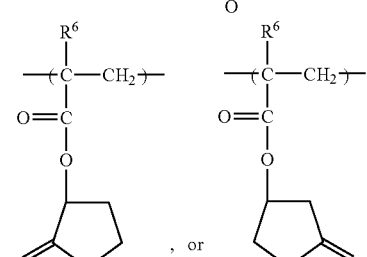

wherein $R^6$ is as defined above.

Alternatively, examples of recurring units having formula (3) include

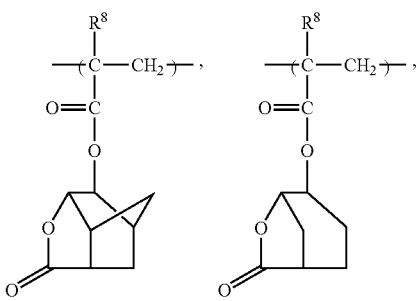

wherein $R^8$ is as defined above.

E in the formula (4) is a group derived from non-bridged or bridged alicyclic hydrocarbons, and more preferably groups derived from cyclohexane, norbornane, tricyclodecane, adamantane, or compounds in which these groups have one or more hydrogens replaced by a methyl group.

Suitable examples of the E structure in the formula (4) include hydroxymethyl group, 1-hydroxyethyl group, 2-hydroxyethyl group, 1-hydroxy-n-propyl group, 2-hydroxy-n-propyl group, 3-hydroxy-n-propyl group, 1-hydroxy-n-butyl group, 2-hydroxy-n-butyl group, 3-hydroxy-n-butyl group, 4-hydroxy-n-butyl group, 3-hydroxycyclopentyl group, 4-hydroxycyclohexyl group, 5-hydroxy-2-norbornyl group, 8-hydroxy-3-tricyclodecanyl group, 8-hydroxy-3-tetracyclododecanyl group, 3-hydroxy-1-adamantyl group, 3-oxocyclopentyl group, 4-oxocyclohexyl group, 5-oxo-2-norbornyl group, 8-oxo-3-tricyclodecanyl group, 8-oxo-3-tetracyclododecanyl group, 4-oxo-1-adamantyl group, cyanomethyl group, 2-cyanoethyl group, 3-cyano-n-propyl group, 4-cyano-n-butyl group, 3-cyanocyclopentyl group, 4-cyanocyclohexyl group, 5-cyano-2-norbornyl group, 8-cyano-3-tricyclodecanyl group, 8-cyano-3-tetracyclododecanyl group, 3-cyano-1-adamantyl group, 2-hydroxy-2,2-di(trifluoromethyl)ethyl group, 3-hydroxy-3,3-di(trifluoromethyl)-n-propyl group, 4-hydroxy-4,4-di(trifluoromethyl)-n-butyl group, 5-[2-hydroxy-2,2-di(trifluoromethyl)ethyl]-2-norbornyl group, 8-[2-hydroxy-2,2-di(trifluoromethyl)ethyl]-3-tricyclodecanyl group, 8-[2-hydroxy-2,2-di(trifluoromethyl)ethyl]-3-tetracyclododecanyl group, and 3-[2-hydroxy-2,2-di(trifluoromethyl)ethyl]-1-adamantyl group.

Of the above-identified E groups, 5-hydroxy-2-norbornyl group, 8-hydroxy-3-tricyclodecanyl group, 3-hydroxy-1-adamantyl group, 5-cyano-2-norbornyl group, 8-cyano-3-tricyclodecanyl group, 3-cyano-1-adamantyl group, 5-[2-hydroxy-2,2-di(trifluoromethyl)ethyl]-2-norbornyl group, 8-[2-hydroxy-2,2-di(trifluoromethyl)ethyl]-3-tricyclodecanyl group are of particular interest.

The percentage of recurring unit (1) in resin (A) of the photoresist composition is from about 10 to about 80 mol %, more particularly from about 20 to about 70 mol %, and still more specifically from about 20 to about 60 mol % of the total content of the recurring units. The total percentage of the recurring unit (3) or (4), in the resin (A) of the photoresist composition is from about 20 to about 80 mol %, more particularly from about 20 to about 60 mol %, and still more specifically from about 30 to about 60 mol % of the total content of the recurring units. The content of other recurring units described throughout the specification that can be incorporated into resin (A) of the photoresist composition is generally about 50 mol % or less, and more particularly 30 mol % or less of the total content of the recurring units.

The resin (A) of the photoresist composition can be prepared by LFRP. Polymerization of the unsaturated monomers is performed in an appropriate solvent, in the presence of a chain transfer agent (CTA), and a radical polymerization initiator such as a hydroperoxide, dialkyl peroxide, diacyl peroxide, or azo compound, as described throughout the specification.

The polystyrene-reduced weight average molecular weight (hereinafter referred to as "Mw") of the resin (A) determined by gel permeation chromatography (GPC) is generally from about 1,000 to about 100,000, more particularly from about 1,000 to about 50,000, and still more specifically from about 2,000-30,000 and still more specifically from about 4,000 to about 12,000.

The ratio of Mw to the polystyrene-reduced number average molecular weight (hereinafter referred to as "Mn") determined by gel permeation chromatography (GPC) (Mw/Mn) of the polymeric resin (A) of the photoresist composition is generally from about 1 to about 1.8, and more particularly from about 1 to about 1.5, e.g., about 1.6.

It is preferable that the resin (A) of the photoresist composition contains almost no impurities such as halogens or metals. The smaller the amount of such impurities, the better the sensitivity, resolution, process stability, pattern shape, and the like of the polymeric resin when utilized in a coating such as, for example, in a photoresist. The resin (A) of the photoresist composition can be purified by using a chemical purification process, such as reprecipitation, washing with water, liquid-liquid extraction, or a combination of a chemical purification process and a physical purification process such as ultrafiltration or centrifugation.

The present invention is also based, at least in part, on the discovery that photosensitive compositions for use at wavelengths below 248 nm, i.e., 193 nm or 157 nm, can be formulated by combining a photo-acid generator and an acrylic or methacrylic based polymeric resin of the photoresist composition that includes ester groups that are sterically bulky. In one aspect, the ester moiety is a monocyclic, bicyclic, tricyclic, or tetracyclic non-aromatic ring, having 5 or more carbon atoms, and can further include a lactone within the cyclic structure. Generation of acid by photolysis in a photoresist composition induces cleavage of the ester group in the polymer resin. This results in a polymeric carboxylic acid that can be removed by treatment with base.

Suitable sterically bulky ester groups include those described throughout the specifiction and include, for example, cyclopentanes, cyclohexanes, adamantanes and norbornanes. Examples of monomers used for preparing the polymeric resins of the photoresist composition having the formula $[A]_x[B]_y[C]_z$, include

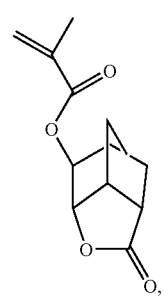

(N1)

-continued (P1) 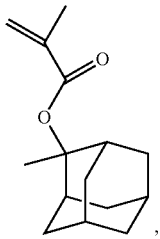

(P2) 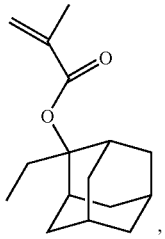

(Q1) 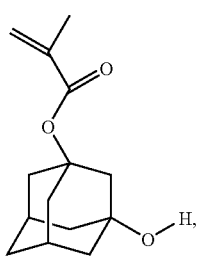

(P3) 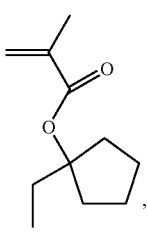

(F-Q2) 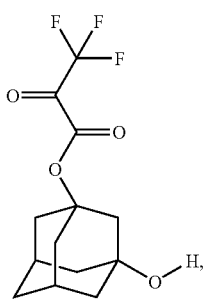

(N2) 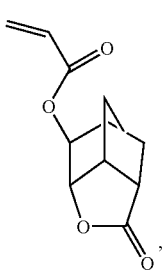

-continued (P4) 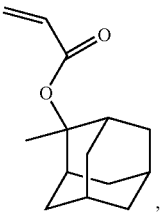

(P5) 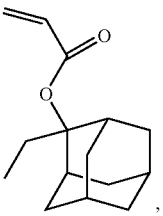

(Q3) 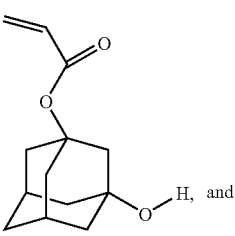

(P6) 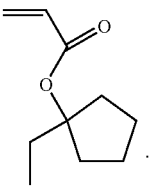

The monomers useful in the synthesis of the polymeric resins of the photoresist composition can be produced, for example, by reacting corresponding hydroxyl adamantans or norbornanes with either methacrylic or acrylic acid acrylic acid derivatives, such as acyl chloride or acetic anhydrides.

Typically, two or more of the above-identified monomers are polymerized in either a batch process, continuous, or a semi-continuous feed process.

In still another aspect, the polymer resins of the photoresist composition have the formula $$[A]_x[B]_y[C]_z \quad (I)$$

wherein A, B and C are each individually one of monomers described throughout the specification.

In one aspect of the invention, "x" is between about 0 to about 200 inclusive, "y" is between about 1 to about 200 inclusive and "z" is between about 1 to about 200 inclusive. In another aspect, "x", "y" and "z" are in the ranges of from about 5 to about 90, from about 10 to about 75, and from about 25 to about 50. In certain aspects of the polymeric resins of the photoresist composition, x has a value of at least 1.

In another aspect of the invention, "y" and "z" are zero and "x" is a non-zero integer, generally having a value of greater than about 10, therefore providing a homopolymer of the monomers identified throughout the application. In certain aspects, the homopolymers are prepared by the method(s) of the invention. In other aspects, the homopolymers do not include homopolymers of N1 or N2. As discussed throughout the specification, the homopolymers have a weight average molecular weight of between about 2,000 and about 30,000. Therefore, "x" is between about 10 and about 150. Such homopolymers of the invention have a polydispersity of less than about 2, more particularly less than about 1.7 and even more particularly between about 1.1 and about 1.4.

In yet another aspect of the invention "x" is at least one and x+y+z equal a total of at least 10. In another aspect, "x", "y" and "z" each individually are in the ranges of from about 5 to about 90, from about 10 to about 75, and from about 25 to about 50. In general, x+y+z equals at least about 10, more particularly at least about 20, and more specifically at least about 25.

In general, the polymer resins of the invention generally have a weight average molecular weight ($M_w$) of between about 2,000 and about 30,000. In certain aspects of the invention, the molecular weights of the polymeric resins are between about 2,000 and about 20,000, between about 3,000 and about 12,000 and also between about 3,000 and about 8,000.

Another important feature of the novel polymers encompassed by the present invention is their narrow polydispersity. The terms "polydispersity" and "polydispersity index" (PDI) are recognized in the art and refer to the ratio of the weight average molecular weight to the number average molecular weight. Polymeric resins of the photoresist composition typically have PDI values below about 2, generally less than about 1.7 and in particular are between about 1.2 to about 1.4. In some instances, the PDI value is between about 1.1 to about 1.2 or less.

In one embodiment, A, B and C, each individually, are selected from

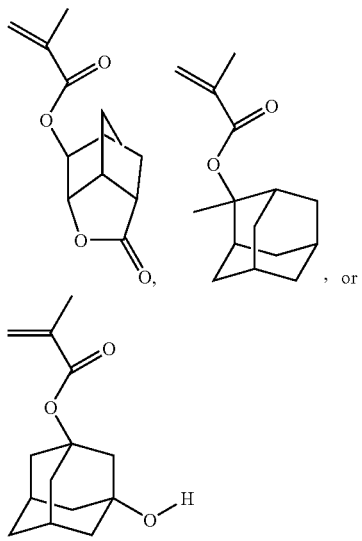

and x is at least one (1). In a specific embodiment, A, B and C are each different (A≠B≠C). In one aspect, the ratio of monomers A, B and C are formulated as 50, 35 and 15, respectively, based on weight percent. More specifically, an exemplary polymeric resin utilizes each of the three different methacrylic monomers (A, B and C) listed supra and has the formula (II)

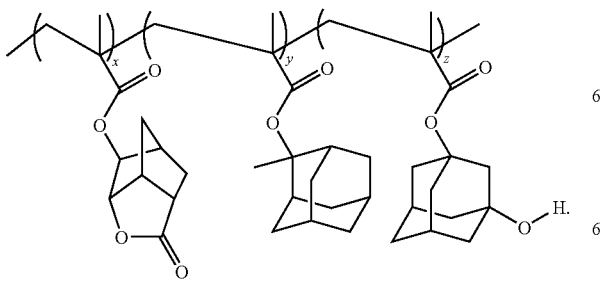

Again, it should be understood by one skilled in the art, that in the polymeric formula $[A]_x[B]_y[C]_z$, monomeric subunits of A, B and C have been polymerized through their respective unsaturated olefinic portions into a resultant polymeric resin. Polymer resins pertaining to formula (II) generally have a $M_w$ of between about 3,000 and 12,000 and a PDI of between about 1.1 and about 1.2.

In another aspect, A, B and C, are each individually selected from

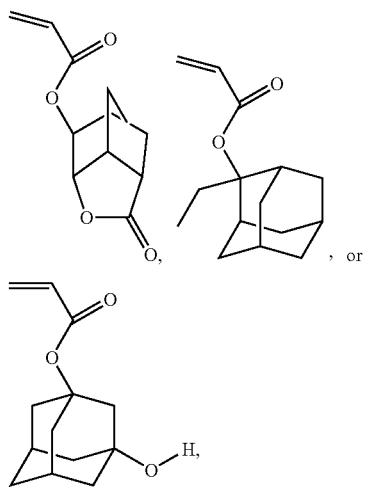

where x is at least one (1). In a specific embodiment, A, B and C are each different (A≠B≠C). In one aspect, the ratio of monomers A, B and C are formulated as 55, 35 and 10, respectively, based on weight percent. For example, a polymer prepared from the three different acrylic monomers (A, B and C) supra can be represented as a polymeric resin having the formula (III)

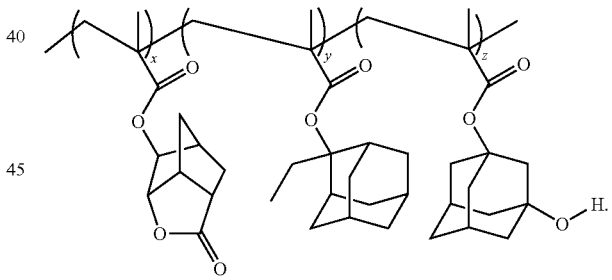

Polymer resins of the photoresist compositions pertaining to formula (III) generally have a $M_w$ of between about 3,000 and 10,000 and a PDI of about 1.3.

In still another embodiment, A, B and C, each individually, are selected from

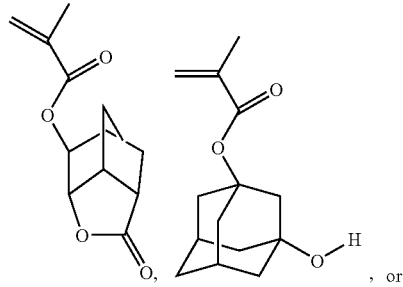

-continued

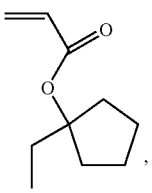

where x is at least one (1). In a specific embodiment, A, B and C are each different (A≠B≠C). In one aspect, the ratio of monomers A, B and C are formulated as 55, 35 and 10, respectively, based on weight percent. For example, a polymer prepared from an acrylic monomer and methacrylic monomers (A, B and C) can be represented by the polymeric resin as

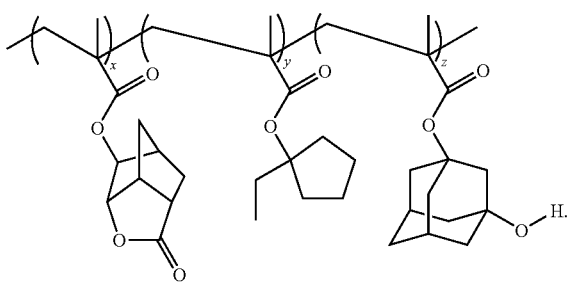

(IV)

Therefore, acrylic esters, methacrylic esters, and mixtures thereof having sterically bulky ester groups have been polymerized by the methods of the invention and are encompassed by the present invention and are useful, for example, in coatings applications, e.g., photoresist materials.

The present invention provides photosensitive polymeric resins of the chemical amplification type. The polymeric resins are suitable for use in photoresist systems where eximer laser lithography is utilized, such as ArF laser lithography, KrF laser lithography and the like. The polymeric resins of the photoresist composition provide excellent properties such as resolution, profile, sensitivity, dry etch resistance, adhesion and the like when used in photoresists.

Polymerization of the monomers (e.g., A, B and C) can be conducted according to conventional methods such as bulk polymerization or by semi-continuous polymerization. For example, the polymeric resin (I) can be obtained by dissolving requisite monomers in an organic solvent, then conducting a polymerization reaction in the presence of a polymerization initiator, such as an azo compound. Use of a chain transfer agent (CTA) during the polymerization process can be advantageous.

Organic solvents suitable for polymerization reactions of the invention include, for example, ketones, ethers, polar aprotic solvents, esters, aromatic solvents and aliphatic hydrocarbons, both linear and cyclic. Exemplary ketones include methyl ethyl ketone (2-butanone) (MEK), acetone and the like. Exemplary ethers include alkoxyalkyl ethers, such as methoxy methyl ether or ethyl ether, tetrahydrofuran, 1,4 dioxane and the like. Polar aprotic solvents include dimethyl formamide, dimethyl sulfoxide and the like. Suitable esters include alkyl acetates, such as ethyl acetate, methyl acetate and the like. Aromatic solvents include alkylaryl solvents, such as toluene, xylene and the like and halogenated aromatics such as chlorobenzene and the like. Hydrocarbon type solvents include, for example, hexane, cyclohexane and the like.

The polymerization conditions that can be used include temperatures for polymerization typically in the range of from about 20° C. to about 110° C., more specifically in the range of from about 50° C. to about 90° C. and even more specifically in the range of from about 60° C. to about 80° C. The atmosphere can be controlled, with an inert atmosphere being advantageous, such as nitrogen or argon. The molecular weight of the polymer is controlled via adjusting the ratio of monomer to CTA. Generally, the molar ratio of monomer to CTA is in the range of from about 5:1 to about 200:1, more specifically in the range of from about 10:1 to about 100:1, and most particularly from 10:1 to about 50:1.

A free radical source is provided in the polymerization mixture, which can stem from spontaneous free radical generation upon heating or in one aspect, from a free radical initiator (radical source generator). In the latter case the initiator is added to the polymerization mixture at a concentration high enough for an acceptable polymerization rate (e.g., commercially significant conversion in a certain period of time, such as listed below). Conversely, a too high free radical initiator to CTA ratio will favor unwanted dead polymer formation through radical-radical coupling reaction leading to polymer materials with uncontrolled characteristics. The molar ratio of free radical initiator to CTA for polymerization are typically in the range of from about 0.5:1 to about 0.02:1, e.g., 0.2:1.

The phrase "free-radical source," within the context of the invention, refers broadly to any and all compounds or mixtures of compounds that can lead to the formation of radical species under appropriate working conditions (thermal activation, irradiation, redox conditions, etc.).

Polymerization conditions also include the time for reaction, which can be from about 0.5 hours to about 72 hours, and more particularly in the range of from about 1 hour to about 24 hours, and even more particularly in the range of from about 2 hours to about 12 hours. Conversion of monomer to polymer is at least about 50%, more particularly at least about 75% and even more particularly at least about 90% or greater.

The initiators employed in the present invention can be a commercially available free-radical initiator. In general, however, initiators having a short half-life at the polymerization temperature are utilized in particular. Such initiators are utilized because the speed of the initiation process can affect the polydispersity index of the resulting polymer. That is, the kinetics of controlled, living polymerization are such that less polydisperse polymer samples are prepared if initiation of all chains occurs at substantially the same time. More specifically, suitable free radical initiators include any thermal, redox or photo initiators, including, for example, alkyl peroxides, substituted alkyl peroxides, aryl peroxides, substituted aryl peroxides, acyl peroxides, alkyl hydroperoxides, substituted alkyl hydroperoxides, aryl hydroperoxides, substituted aryl hydroperoxides, heteroalkyl peroxides, substituted heteroalkyl peroxides, heteroalkyl hydroperoxides, substituted heteroalkyl hydroperoxides, heteroaryl peroxides, substituted heteroaryl peroxides, heteroaryl hydroperoxides, substituted heteroaryl hydroperoxides, alkyl peresters, substituted alkyl peresters, aryl peresters, substituted aryl peresters, azo compounds and halide compounds. Specific initiators include cumene hydroperoxide (CHP), t-butyl hydroperoxide (TBHP), t-butyl perbenzoate (TBPB), sodium carbonateperoxide, benzoyl peroxide (BPO), lauroyl peroxide (LPO), methylethylketone peroxide 45%, potassium persulfate, ammonium persulfate, 2,2-azobis(2,4-dimethyl-valeronitrile) (VAZO®-65), 1,1-azobis(cyclohexanecarbonitrile) (VAZO®-40), 2,2-azobis(N,N'-dimethyleneisobutyramidine)dihydrochloride (VAZO®-044), 2,2-azobis(2-amidino-propane)dihydrochloride (VAZO®-50) and 2,2-azobis(2-amido-propane)dihydrochloride. Redox pairs such as persulfate/sulfite and $Fe(2^+)$/peroxide are also useful. Initiation may also be by heat or UV light, as is known in the art, depending on the embodiment being practiced (e.g., UV light may be used for the modified initiator or RAFT or MADIX techniques discussed herein). Those of skill in the art can select a proper initiator within the scope of this invention.

Chain transfer agents (CTAs) are known in the art and are used to help control free radical polymerizations. Ultimately, many different types of CTAs can be incorporated into the terminus of a polymer as further explained below. Examples of suitable CTAs useful in the present invention include those described in U.S. Pat. No. 6,512,021, WO98/01478, WO99/35177, WO99/31144, WO99/05099 and WO98/58974, each of which is incorporated herein by reference.

Additional examples include CTAs described in U.S. Pat. Nos. 6,395,850, 6,518,364, U.S. patent application Ser. No. 10/407,405, entitled "Cleaving and Replacing Thio Control Agent Moieties from Polymers made by Living-Type Free Radical Polymerization" filed on Apr. 3, 2003 and U.S. patent application Ser. No. 10/104,740, filed Mar. 22, 2002, the teachings of which are incorporated herein by reference in their entirety.

The use and mechanism of reversible control agents for free radical polymerization is now generally known and coined as RAFT (Reversible Addition Fragmentation Transfer), see for example, U.S. Pat. No. 6,153,705, WO 98/01478, WO 99/35177, WO 99/31144, and WO 98/58974, each of which is incorporated herein by reference. Recently new agents have been disclosed which are readily available for polymerizing desired monomers under commercially acceptable conditions, which include high conversion at the shortest possible reaction times and lower temperatures, see for example U.S. Pat. Nos. 6,380,335, 6,395,850, and 6,518,364, each of which is incorporated herein by reference.

In general CTAs useful in the present invention have the general formula:

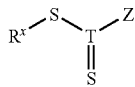

wherein $R^x$ is generally any group that is sufficiently labile to be expelled as its free radical form, T is carbon or phosphorus, and Z is any group that activates the C=S double bond towards a reversible free radical addition fragmentation reaction and may be selected from the group consisting of amino and alkoxy. In other embodiments, Z is attached to C=S through a carbon atom (dithioesters), a nitrogen atom (dithiocarbamate), a sulfur atom (trithiocarbonate) or an oxygen atom (dithiocarbonate). Specific examples for Z can be found in WO98/01478, WO99/35177, WO99/31144, and WO98/58974, each of which is incorporated herein by reference. In some embodiments, Z is selected from the group consisting of hydrocarbyl, substituted hydrocarbyl, heteroatom-containing hydrocarbyl, substituted heteroatom-containing hydrocarbyl, and combinations thereof. More specifically, Z may be selected from the group consisting of hydrogen, optionally substituted alkyl, optionally substituted aryl, optionally substituted alkenyl, optionally substituted acyl, optionally substituted, aroyl, optionally substituted alkoxy, optionally substituted heteroaryl, optionally substituted heterocyclyl, optionally substituted alkylsulfonyl, optionally substituted alkylsulfinyl, optionally substituted alkylphosphonyl, optionally substituted arylsulfinyl, and optionally substituted arylphosphonyl.

In particular, suitable CTAs useful in the present invention include those identified in U.S. Pat. No. 6,380,335, the contents of which are incorporated by reference. More specifically, CTAs of particular interest in combination with the monomers utilized throughout the specification can be characterized by the general formula:

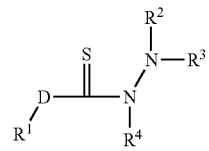

wherein D is S, Te or Se. In one aspect, D is sulfur. $R^1$ is generally any group that can be easily expelled under its free radical form ($R^1$•) upon an addition-fragmentation reaction, as depicted below in Scheme A (showing D as S):

Scheme A

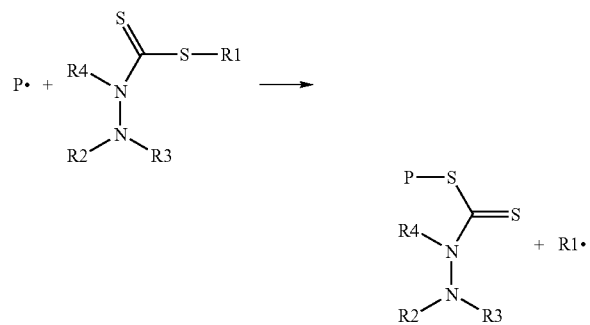

In Scheme A, P• is a free radical, typically a macroradical, such as polymer chain. More specifically, $R^1$ is selected from the group consisting of hydrocarbyl, substituted hydrocarbyl, heteroatom-containing hydrocarbyl, and substituted heteroatom-containing hydrocarbyl, and combinations thereof. Even more specifically, $R^1$ is selected from the group consisting of optionally substituted alkyl, optionally substituted aryl, optionally substituted alkenyl, optionally substituted alkoxy, optionally substituted heterocyclyl, optionally substituted alkylthio, optionally substituted amino and optionally substituted polymer chains. And still more specifically, $R^1$ is selected from the group consisting of —$CH_2Ph$, —$CH(CH_3)CO_2CH_2CH_3$, —$CH(CO_2CH_2CH_3)_2$, —$C(CH_3)_2CN$, —$CH(Ph)CN$, —$C(CH_3)_2CO_2R$ (alkyl, aryl, etc.) and —$C(CH_3)_2Ph$.

Also, $R^2$ and $R^3$ of the CTA are each independently selected from the group consisting of hydrogen, hydrocarbyl, substituted hydrocarbyl, heteroatom-containing hydrocarbyl, and substituted heteroatom-containing hydrocarbyl, and combinations thereof. More specifically, $R^2$ and $R^3$ can be each independently selected from the group consisting of hydrogen, optionally substituted alkyl, optionally substituted aryl, optionally substituted alkenyl, optionally substituted acyl, optionally substituted, aroyl, optionally substituted alkoxy, optionally substituted heteroaryl, optionally substituted heterocyclyl, optionally substituted alkylsulfonyl, optionally substituted alkylsulfinyl, optionally substituted alkylphosphonyl, optionally substituted arylsulfinyl, and optionally substituted arylphosphonyl. Specific embodiments of $R^2$ and/or $R^3$ are listed in the above definitions, and in addition include perfluorenated aromatic rings, such as perfluorophenyl. Also optionally, $R^2$ and $R^3$ can together form a double bond alkenyl moiety off the nitrogen atom, and in that case $R^2$ and $R^3$ are together optionally substituted alkenyl moieties.

Finally, $R^4$ of the CTA is selected from the group consisting of hydrogen, hydrocarbyl, substituted hydrocarbyl, heteroatom-containing hydrocarbyl, and substituted heteroatom-containing hydrocarbyl, and combinations thereof; and optionally, $R^4$ combines with $R^2$ and/or $R^3$ to form a ring structure, with said ring having from 3 to 50 non-hydrogen atoms. In particular, $R^4$ is selected from the group consisting of hydrogen, optionally substituted alkyl, optionally substituted aryl, optionally substituted alkenyl, optionally substituted acyl, optionally substituted aryl, amino, thio, optionally substituted aryloxy and optionally substituted alkoxy. Specific $R^4$ groups include methyl and phenyl.

As used herein, the phrase "having the structure" is not intended to be limiting and is used in the same way that the term "comprising" is commonly used. The term "independently selected from the group consisting of" is used herein to indicate that the recited elements, e.g., R groups or the like, can be identical or different (e.g., $R^2$ and $R^3$ in the structure of formula (1) may all be substituted alkyl groups, or $R^2$ may be hydrido and $R^3$ may be methyl, etc.).

"Optional" or "optionally" means that the subsequently described event or circumstance may or may not occur, and that the description includes instances where said event or circumstance occurs and instances where it does not. For example, the phrase "optionally substituted hydrocarbyl" means that a hydrocarbyl moiety may or may not be substituted and that the description includes both unsubstituted hydrocarbyl and hydrocarbyl where there is substitution.

The term "alkyl" as used herein refers to a branched or unbranched saturated hydrocarbon group typically although not necessarily containing 1 to about 24 carbon atoms, such as methyl, ethyl, n-propyl, isopropyl, n-butyl, isobutyl, t-butyl, octyl, decyl, and the like, as well as cycloalkyl groups such as cyclopentyl, cyclohexyl and the like. Generally, although again not necessarily, alkyl groups herein contain 1 to about 12 carbon atoms. The term "lower alkyl" intends an alkyl group of one to six carbon atoms, preferably one to four carbon atoms. "Substituted alkyl" refers to alkyl substituted with one or more substituent groups, and the terms "heteroatom-containing alkyl" and "heteroalkyl" refer to alkyl in which at least one carbon atom is replaced with a heteroatom.

The term "alkenyl" as used herein refers to a branched or unbranched hydrocarbon group typically although not necessarily containing 2 to about 24 carbon atoms and at least one double bond, such as ethenyl, n-propenyl, isopropenyl, n-butenyl, isobutenyl, octenyl, decenyl, and the like. Generally, although again not necessarily, alkenyl groups herein contain 2 to about 12 carbon atoms. The term "lower alkenyl" intends an alkenyl group of two to six carbon atoms, preferably two to four carbon atoms. "Substituted alkenyl" refers to alkenyl substituted with one or more substituent groups, and the terms "heteroatom-containing alkenyl" and "heteroalkenyl" refer to alkenyl in which at least one carbon atom is replaced with a heteroatom.

The term "alkynyl" as used herein refers to a branched or unbranched hydrocarbon group typically although not necessarily containing 2 to about 24 carbon atoms and at least one triple bond, such as ethynyl, n-propynyl, isopropynyl, n-butynyl, isobutynyl, octynyl, decynyl, and the like. Generally, although again not necessarily, alkynyl groups herein contain 2 to about 12 carbon atoms. The term "lower alkynyl" intends an alkynyl group of two to six carbon atoms, preferably three or four carbon atoms. "Substituted alkynyl" refers to alkynyl substituted with one or more substituent groups, and the terms "heteroatom-containing alkynyl" and "heteroalkynyl" refer to alkynyl in which at least one carbon atom is replaced with a heteroatom.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing one to six, more preferably one to four, carbon atoms. The term "aryloxy" is used in a similar fashion, with aryl as defined below.

Similarly, the term "alkyl thio" as used herein intends an alkyl group bound through a single, terminal thioether linkage; that is, an "alkyl thio" group may be represented as —S-alkyl where alkyl is as defined above. A "lower alkyl thio" group intends an alkyl thio group containing one to six, more preferably one to four, carbon atoms.

The term "allenyl" is used herein in the conventional sense to refer to a molecular segment having the structure —CH=C=CH2. An "allenyl" group may be unsubstituted or substituted with one or more non-hydrogen substituents.

The term "aryl" as used herein, and unless otherwise specified, refers to an aromatic substituent containing a single aromatic ring or multiple aromatic rings that are fused together, linked covalently, or linked to a common group such as a methylene or ethylene moiety. The common linking group may also be a carbonyl as in benzophenone, an oxygen atom as in diphenylether, or a nitrogen atom as in diphenylamine. Preferred aryl groups contain one aromatic ring or two fused or linked aromatic rings, e.g., phenyl, naphthyl, biphenyl, diphenylether, diphenylamine, benzophenone, and the like. In particular embodiments, aryl substituents have 1 to about 200 carbon atoms, typically 1 to about 50 carbon atoms, and preferably 1 to about 20 carbon atoms. "Substituted aryl" refers to an aryl moiety substituted with one or more substituent groups, (e.g., tolyl, mesityl and perfluorophenyl) and the terms "heteroatom-containing aryl" and "heteroaryl" refer to aryl in which at least one carbon atom is replaced with a heteroatom.

The term "aralkyl" refers to an alkyl group with an aryl substituent, and the term "aralkylene" refers to an alkylene group with an aryl substituent; the term "alkaryl" refers to an aryl group that has an alkyl substituent, and the term "alkarylene" refers to an arylene group with an alkyl substituent.

The terms "halo" and "halogen" are used in the conventional sense to refer to a chloro, bromo, fluoro or iodo substituent. The terms "haloalkyl," "haloalkenyl" or "haloalkynyl" (or "halogenated alkyl," "halogenated alkenyl," or "halogenated alkynyl") refers to an alkyl, alkenyl or alkynyl group, respectively, in which at least one of the hydrogen atoms in the group has been replaced with a halogen atom.

The term "heteroatom-containing" as in a "heteroatom-containing hydrocarbyl group" refers to a molecule or molecular fragment in which one or more carbon atoms is replaced with an atom other than carbon, e.g., nitrogen, oxygen, sulfur, phosphorus or silicon. Similarly, the term "heteroalkyl" refers to an alkyl substituent that is heteroatom-containing, the term "heterocyclic" refers to a cyclic substituent that is heteroatom-containing, the term "heteroaryl" refers to an aryl substituent that is heteroatom-containing, and the like. When the term "heteroatom-containing"

appears prior to a list of possible heteroatom-containing groups, it is intended that the term apply to every member of that group. That is, the phrase "heteroatom-containing alkyl, alkenyl and alkynyl" is to be interpreted as "heteroatom-containing alkyl, heteroatom-containing alkenyl and heteroatom-containing alkynyl."

"Hydrocarbyl" refers to univalent hydrocarbyl radicals containing 1 to about 30 carbon atoms, preferably 1 to about 24 carbon atoms, most preferably 1 to about 12 carbon atoms, including branched or unbranched, saturated or unsaturated species, such as alkyl groups, alkenyl groups, aryl groups, and the like. The term "lower hydrocarbyl" intends a hydrocarbyl group of one to six carbon atoms, preferably one to four carbon atoms. "Substituted hydrocarbyl" refers to hydrocarbyl substituted with one or more substituent groups, and the terms "heteroatom-containing hydrocarbyl" and "heterohydrocarbyl" refer to hydrocarbyl in which at least one carbon atom is replaced with a heteroatom.

By "substituted" as in "substituted hydrocarbyl," "substituted aryl," "substituted alkyl," "substituted alkenyl" and the like, as alluded to in some of the aforementioned definitions, is meant that in the hydrocarbyl, hydrocarbylene, alkyl, alkenyl or other moiety, at least one hydrogen atom bound to a carbon atom is replaced with one or more substituents that are groups such as hydroxyl, alkoxy, thio, phosphino, amino, halo, silyl, and the like. When the term "substituted" appears prior to a list of possible substituted groups, it is intended that the term apply to every member of that group. That is, the phrase "substituted alkyl, alkenyl and alkynyl" is to be interpreted as "substituted alkyl, substituted alkenyl and substituted alkynyl." Similarly, "optionally substituted alkyl, alkenyl and alkynyl" is to be interpreted as "optionally substituted alkyl, optionally substituted alkenyl and optionally substituted alkynyl."

As used herein the term "silyl" refers to the —SiZ1Z2Z3 radical, where each of Z1, Z2, and Z3 is independently selected from the group consisting of hydrido and optionally substituted alkyl, alkenyl, alkynyl, aryl, aralkyl, alkaryl, heterocyclic, alkoxy, aryloxy and amino.

As used herein, the term "phosphino" refers to the group —PZ1 Z2, where each of Z1 and Z2 is independently selected from the group consisting of hydrido and optionally substituted alkyl, alkenyl, alkynyl, aryl, aralkyl, alkaryl, heterocyclic and amino.

The term "amino" is used herein to refer to the group —NZ1Z2, where each of Z1 and Z2 is independently selected from the group consisting of hydrido and optionally substituted alkyl, alkenyl, alkynyl, aryl, aralkyl, alkaryl and heterocyclic.

The term "thio" is used herein to refer to the group —SZ1, where Z1 is selected from the group consisting of hydrido and optionally substituted alkyl, alkenyl, alkynyl, aryl, aralkyl, alkaryl and heterocyclic.

As used herein all reference to the elements and groups of the Periodic Table of the Elements is to the version of the table published by the Handbook of Chemistry and Physics, CRC Press, 1995, which sets forth the new IUPAC system for numbering groups.

In certain embodiments, $R^4$ combines with either $R^2$ or $R^3$ to form a substituted or unsubstituted pyrazole moiety.

Exemplary CTAs include, for example,

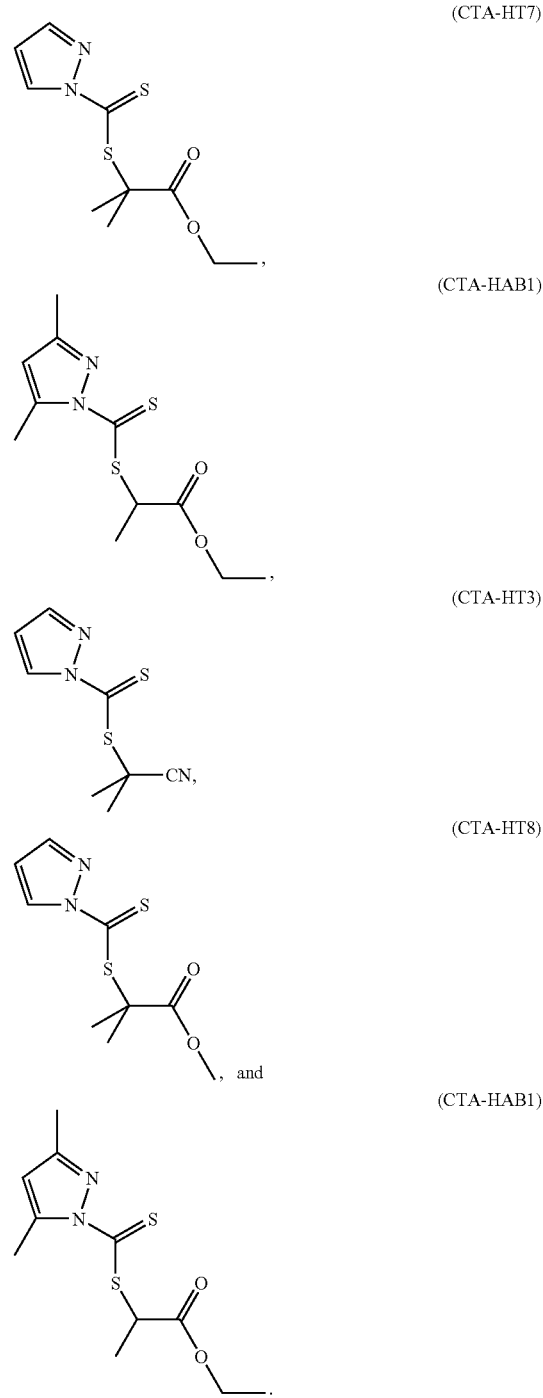

In some embodiments, the resulting polymers of the photoresist composition described above will have one or more termini having, for example, a thio group (from a CTA). Depending on the application intended for the polymer, the thio group may be undesirable. Thus, this invention also provides polymeric resins that have the CTA eliminated from the polymeric resin termini.

In certain embodiments described throughout the specification, the resulting polymer contains a CTA moiety (a portion of the CTA, such as the dithio carbonyl portion) at a terminal end, whether the end is at the end of a backbone, a star arm, a comb end, a branch end, or a graft. Removal of the CTA can be accomplished by several methods described below. Mechanistically, a free radical chain transfer reaction is believed to decouple a residue, such as the dithio CTA moiety, from the polymer end by addition of an external radical source.

In one embodiment, it is advantageous in some instances to remove at least the sulfur containing portion of the CTA from the polymer terminal end (if present) position by cleaving the CTA moiety (e.g., a thiocarbonylthio moiety, a thio group) from the polymer terminus. In one embodiment, this can be accomplished by radical reduction of the dithiocarbonyl or dithiophosphoryl groups using a free radical intitiator and a compound bearing a labile hydrogen atom. The method essentially removes the unwanted group from the polymer chain end and replaces it with a hydrogen atom. See for example, WO 02/090397, which is incorporated herein by reference in its entirety.

In another aspect, the CTA can be replaced by use of excess initiator, whereby a fragmentation product of the initiator replaces the CTA at the termini of the polymer as described in U.S. patent application Ser. No. 10/407,405, entitled "Cleaving and Replacing Thio Control Agent Moieties from Polymers made by Living-Type Free Radical Polymerization" filed on Apr. 3, 2003, the teachings of which are incorporated herein by reference in their entirety.

In yet another aspect, the CTA can be replaced by use of initiator in combination with a RAFT agent as described in U.S. patent application Ser. No. 10/407,405, entitled "Cleaving and Replacing Thio Control Agent Moieties from Polymers made by Living-Type Free Radical Polymerization" filed on Apr. 3, 2003, the teachings of which are incorporated herein by reference in their entirety.

In still another aspect, the CTA can be replaced by a non-homopolymerizable monomer that is introduced with the radical source as described in U.S. patent application Ser. No. 10/609,255, entitled "Removal of the Thiocarbonylthio or Thiophosphorylthio End Group of Polymers and Further Functionalization Thereof" filed on Jun. 26, 2003, the teachings of which is incorporated herein by reference in their entirety.

Wishing not to be bound to any particular theory, it is thought the cleavage of the thio group from the polymer proceeds through a set of reactions described below in Schemes 1 and 2:

Scheme 1

Scheme 2

where P represents the polymer, T is carbon or phosphorus, S is sulfur, $I_2$ a free radical source, I● is a free radical stemming from $I_2$ decomposition, and Z is as defined above. Scheme 1 represents the activation of the free radical initiator yielding radical I●; and scheme 2 represents the addition-fragmentation of I● on the dithio-terminated polymer generating a polymer radical P●.

In some embodiments, the external radical source is a common radical initiator, such as any initiator listed above. Regardless of its exact nature, the free-radical source implemented in the procedure according to the invention is utilized under cleavage reaction conditions that allow for the production of free radicals, which, in one embodiment, is accomplished via thermal activation, i.e., by raising the temperature of the reaction medium, usually to a temperature in the range of about room temperature (approximately 20° C.) to about 200° C., and specifically from about 40° C. to about 180° C., and more specifically from about 50° C. to about 120° C. In other embodiments, free radicals are produced via light activation. This includes free radical sources activatable by UV light, such as benzoin ethers, and benzophenone. High energy radiations such as Gamma rays and electron beams are also known to produce radicals.

The free-radical source utilized can be introduced into the reaction medium in one single increment. However, it can also be introduced gradually, either by portions or continuously.

The cleavage reaction conditions that can be used include conditions such as temperature, pressure, atmosphere, reaction times and ratios of reaction components. Temperatures useful are those in the range of from about room temperature (approximately 20° C.) to about 200° C., and specifically from about 40° C. to about 180° C., and more specifically from about 50° C. to about 120° C. In some embodiments, the atmosphere can be controlled, with an inert atmosphere being utilized, such as nitrogen or argon. In other embodiments, ambient atmosphere is used. The cleavage reaction conditions also include open or closed atmospheres and pressures at ambient conditions. In embodiments in which the cleavage reaction is carried out in a closed atmosphere, and the temperature is above room temperature, the pressure could rise as a result of any heated solvents. In some embodiments light control is also desired. Specifically, the reaction can be carried out in visible light, or under UV light.

The quantity of the free-radical source depends on its effectiveness, on the manner in which the source is introduced, and on the desired end product. The free-radical source that is utilized can be introduced in a quantity such that the amount of free radicals that can be released by the source is between about 1% and about 800% (molar), specifically between about 50% and about 400% (molar), and more specifically between about 100% and about 300% (molar), and more specifically between about 200% and about 300% in relation to the total molar amount of the groups in the polymers for which cleavage is desired. In some embodiments, complete removal or as near as complete as possible is desired and in those embodiments, an excess of free radical source is introduced.

The excess free radical source is intended to account for the side reactions that are well known in free radical processes such as those mentioned below (e.g. scheme 5), as well as the possible free radical loss caused by the cage effect. When available, the free radical source efficiency factor, f, defined as the ratio of active radicals to total radicals generated upon free radical source decomposition, can be used to adjust the concentration of $I_2$.

Most known free radical sources can be used, as long as the half-life time (defined as the time after which half of the free radical source has been consumed) is between approximately 10 minutes and 20 hours.

Typical initiators that can be used as a free radical source are selected among alkyl peroxides, substituted alkyl peroxides, aryl peroxides, substituted aryl peroxides, acyl peroxides, alkyl hydroperoxides, substituted alkyl hydroperoxides, aryl hydroperoxides, substituted aryl hydroperoxides, heteroalkyl peroxides, substituted heteroalkyl peroxides, heteroalkyl hydroperoxides, substituted heteroalkyl hydroperoxides, heteroaryl peroxides, substituted heteroaryl peroxides, heteroaryl hydroperoxides, substituted heteroaryl hydroperoxides, alkyl peresters, substituted alkyl peresters, aryl peresters, substituted aryl peresters, dialkylperdicarbonate, inorganic peroxides, hyponitrites and azo compounds. Specific initiators include lauroyl and benzoylperoxide (BPO) and AIBN. Some azo compounds include 1,1'-Azobis (cyclohexane-1-carbonitrile), 2,2'-Azobis(4-methoxy-2,4-dimethyl valeronitrile), Dimethyl 2,2'-azobis(2-methylpropionate), 1-[(cyano-1-methylethyl)azo]formamide, 2,2'-Azobis(N-cyclohexyl-2-methylpropionamide), 2,2'-Azobis (2,4-dimethyl valeronitrile), 2,2'-Azobis(2-methylbutyronitrile), 2,2'-Azobis[N-(2-propenyl)-2-methylpropionamide], 2,2'-Azobis(N-butyl-2-methylpropionamide), 2,2'-Azobis[2-(5-methyl-2-imidazolin-2-yl)propane]dihydrochloride, 2,2'-Azobis[2-(2-imidazolin-2-yl)propane disulfate dihydrate, 2,2'-Azobis[N-(2-carboxyethyl)-2-methylpropionamidine]tetrahydrate, 2,2'-Azobis {2-[1-(2-hydroxyethyl)-2-imidazolin-2-yl]propane}dihydrochloride, 2,2'-Azobis {2-methyl-N-[1,1-bis (hydroxymethyl)-2-hydroxyethyl]propionamide, 2,2'-Azobis[2-methyl-N-(2-hydroxyethyl)propionamide], 2,2'-Azobis[2-(2-imidazolin-2-yl)propane]dihydrochloride, 2,2'-Azobis(2-methylpropionamide)dihydrochloride, 2,2'-Azobis[2-(3,4,5,6-tetrahydropyrimidin-2-yl)propane] dihydrochloride, 2,2'-Azobis[2-(2-imidazolin-2-yl) propane], and 2,2'-Azobis{2-methyl-N-[2-(1-hydroxybuthyl)]propionamide}. This includes initiators activatable by UV such as benzoin ethers, and benzophenone. Other initiators are activatable by high energy such as gamma rays and electron beams. The half-life time can be adjusted by setting the reaction temperature to the required range. The latter is determined by the temperature dependence of the initiator decomposition rate, available through the supplier information package or in the literature (e.g. "The Chemistry of Free Radical Polymerization, G. Moad, D. H. Salomon, Eds. Pergamon Pub. 1995). The rate of decomposition, hence the radical production, is also adjustable by the addition of reducing agents, in particular when the initiator has an oxidizing character, such as peroxides: for instance metabisulfite, ascorbic acid, sulfite-formaldehyde adduct, amines, and low oxidation state metals, etc., can be used together with peroxides type initiators to accelerate the radical flux.

Cleavage reaction conditions also include the time for reaction, which can be from about 0.5 hours to about 72 hours, more particularly in the range of from about 1 hour to about 24 hours, and even more particularly in the range of from about 2 hours to about 12 hours. Cleavage of thio group, for example, from the polymer is at least about 50%, more specifically at least about 75% and more specifically at least about 85%, and even more specifically at least about 95%. Replacement of the thio groups is at least about 50%, more specifically at least about 75% and more specifically at least about 85%, and even more specifically at least about 95%.

The thio groups can be replaced with a variety of different moieties as detailed above with various RAFT agents, etc. In one embodiment, as described in WO 02/090397 (assigned to Rhodia Chimie), the thio moiety of the CTA can be replaced by a hydrogen atom. In another embodiment, the thio group can be replaced by a non homopolymerizable monomer unit. In still another embodiment, only a free radical source is introduced to cap the polymer termini.

The cleavage reaction mixture can use a reaction media that is typically a solvent. Cleavage reaction conditions also include stirring or refluxing the reaction media. The resulting polymer radical, P•, can then be capped in one of three ways as shown below in Schemes 3, 4 and 5:

Scheme 3

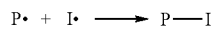

Scheme 4

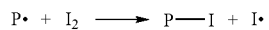

Scheme 5

Scheme 3 represents the radical coupling of the polymer radical generated in scheme 2 and the free radical generated in scheme 1, which produces the resulting capped polymer P—I. Scheme 4 represents a transfer reaction between the polymer radical generated in scheme 2 and the free radical initiator that produces the cleaved polymer as well a new free radical source. Scheme 5 represents a coupling reaction between two polymer radicals.

In one embodiment, schemes 3 and 4 are the desired reactions. Scheme 5 is a side reaction that contributes in increasing molecular weight and broadening molecular weight distribution of the bulk polymer sample. It has been found that the described cleavage reaction conditions lead to quantitative cleavage of dithiocompounds, for example, with little to no change in molecular weight characteristics (Mw and polydispersity index).

In one embodiment, the polymer is treated with free radical source, such as an initiator, under cleavage reaction conditions so that the reactions 3 and 4 are favored. These conditions include introducing the radical source in a quantity such that the amount of free radicals that can be released by the source is between about 200% and about 500% (molar), specifically between about 200% and about 300% (molar) in relation to the total molar amount of the groups in the polymers for which cleavage is desired.

The resulting polymer has a new group at its terminus which may make the polymer more desirable for specific applications. For example, the polymer above may be more desirable for applications that cannot allow the presence of sulfur in the amounts present in the polymer before modification, such as home and personal care products where odor may present a problem.

It is advantageous that the reaction product, either with a CTA terminal group or without, is purified by re-precipitation or the like, after completion of the polymerization reaction. Typical precipitation agents include low molecular weight alcohols, such as isopropyl, methyl, ethyl, and butyl alcohols.

The present invention is a photoresist polymer composition that includes a photo-acid generator which generates an acid upon exposure to an energy source (hereinafter referred to as "photo-acid generator (B)").

The photo-acid generator (B) causes the acid-dissociable group in the resin (A) to dissociate by the action of an acid generated upon exposure. As a result, exposed areas of the resist film become readily soluble in an alkaline developer, whereby a positive-tone resist pattern is formed.

Useful photo-acid generators (B) of the present invention include those compounds shown by the following formula (5):

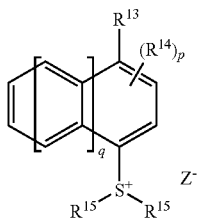

wherein $R^{13}$ represents a hydrogen atom, a hydroxyl group, a linear or branched alkyl group having 1-10 carbon atoms, a linear or branched alkoxyl group having 1-10 carbon atoms, or a linear or branched alkoxycarbonyl group having 2-11 carbon atoms, $R^{14}$ represents a hydrogen atom or a linear or branched alkyl group having 1-10 carbon atoms, p is an integer of 0-3, $R^{15}$ each individually represents a linear or branched alkyl group having 1-10 carbon atoms, phenyl group or naphtyl group which may have one or more substituents, or two $R^{15}$ groups together form a substituted or unsubstituted divalent group having 2-10 carbon atoms, q is an integer of 0-2, and $Z^-$ indicates an anion, for example, having a structure $C_aF_{2a+1}SO_3-$, wherein a is an integer of 1-10.

Examples of linear or branched alkyl groups having from about 1 to about 10 carbon atoms represented by $R^{13}$, $R^{14}$, or $R^{15}$ in formula (5), a methyl group, ethyl group, n-propyl group, i-propyl group, n-butyl group, 2-methylpropyl group, 1-methylpropyl group, t-butyl group, n-pentyl group, neopentyl group, n-hexyl group, n-heptyl group, n-octyl group, 2-ethylhexyl group, n-nonyl group, and n-decyl group are representative.

Examples of linear or branched alkoxyl groups having from about 1 to about 10 carbon atoms represented by $R^{13}$ in formula (5), include a methoxy group, ethoxy group, n-propoxy group, i-propoxy group, n-butoxy group, 2-methylpropoxy group, 1-methylpropoxy group, t-butoxy group, n-pentyloxy group, neopentyloxy group, n-hexyloxy group, n-heptyloxy group, n-octyloxy group, 2-ethylhexyloxy group, n-nonyloxy group, and an n-decyloxy group.

Examples of linear or branched alkoxycarbonyl groups having from about 2 to about 11 carbon atoms represented by $R^{13}$ in formula (5), include a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, neopentyloxycarbonyl group, n-hexyloxycarbonyl group, n-heptyloxycarbonyl group, n-octyloxycarbonyl group, 2-ethylhexyloxycarbonyl group, n-nonyloxycarbonyl group, and an n-decyloxycarbonyl group.

Specific groups for $R^{13}$ in the formula (5) include a hydrogen atom, hydroxyl group, methoxy group, ethoxy group, n-butoxy group, and the like.

As the group $R^{14}$ in the formula (5), a hydrogen atom and a methyl group are specifically noted.

In certain embodiments, p is either 0 or 1.

The following groups are provided as examples of substituted or unsubstituted phenyl groups represented by $R^{15}$ in the formula (5):

a phenyl group or alkyl-substituted phenyl groups which can be substituted with one or more linear, branched, or cyclic alkyl groups having from about 1 to about 10 carbon atoms, such as an o-tolyl group, m-tolyl group, p-tolyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 2,4,6-trimethylphenyl group, and 4-ethylphenyl group; and groups obtained by substitution of the phenyl group or alkyl-substituted phenyl groups with one or more groups such as a hydroxyl group, carboxyl group, cyano group, nitro group, alkoxyl group, alkoxyalkyl group, alkoxycarbonyl group, and alkoxycarbonyloxy group.

Examples of an alkoxyl group that can serve as substituents for the phenyl group or alkyl-substituted phenyl groups, linear, branched, or cyclic alkoxyl groups having from about 1 to about 20 carbon atoms such as a methoxy group, ethoxy group, n-propoxy group, i-propoxy group, n-butoxy group, 2-methylpropoxy group, 1-methylpropoxy group, t-butoxy group, cyclopentyloxy group, and cyclohexyloxy group are representative.

Examples of an alkoxyalkyl group, linear, branched, or cyclic alkoxyalkyl groups having from about 2 to about 21 carbon atoms such as a methoxymethyl group, ethoxymethyl group, 1-methoxyethyl group, 2-methoxyethyl group, 1-ethoxyethyl group, and 2-ethoxyethyl group are representative.

Examples of alkoxycarbonyl groups are linear, branched, or cyclic alkoxycarbonyl groups having from about 2 to about 21 carbon atoms such as a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, cyclopentyloxycarbonyl group, and a cyclohexyloxycarbonyl group.

Examples of alkoxycarbonyloxy groups include linear, branched, or cyclic alkoxycarbonyloxy groups having from about 2 to about 21 carbon atoms such as a methoxycarbonyloxy group, ethoxycarbonyloxy group, n-propoxycarbonyloxy group, i-propoxycarbonyloxy group, n-butoxycarbonyloxy group, t-butoxycarbonyloxy group, and cyclopentyloxycarbonyl group, and a cyclohexyloxycarbonyl group.

Examples of substituted or unsubstituted naphthyl groups represented by $R^{15}$, include a naphthyl group and naphthyl group derivatives obtained by replacement of a hydrogen atom in the naphthyl group by a linear, branched, or cyclic alkyl group having from about 1 to about 10 carbon atoms, such as a 1-naphthyl group, 2-methyl-1-naphthyl group, 3-methyl-1-naphthyl group, 4-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 2,3-dimethyl-1-naphthyl group, 2,4-dimethyl-1-naphthyl group, 2,5-dimethyl-1-naphthyl group, 2,6-dimethyl-1-naphthyl group, 2,7-dimethyl-1-naphthyl group, 2,8-dimethyl-1-naphthyl group, 3,4-dimethyl-1-naphthyl group, 3,5-dimethyl-1-naphthyl group, 3,6-dimethyl-1-naphthyl group, 3,7-dimethyl-1-naphthyl group, 3,8-dimethyl-1-naphthyl group, 4,5-dimethyl-1-naphthyl group, 5,8-dimethyl-1-naphthyl group, 4-ethyl-1-naphthyl group, 2-naphthyl group, 1-methyl-2-naphthyl group, 3-methyl-2-naphthyl group, and 4-methyl-2-naphthyl group, as well as the groups obtained by further substituting one or more hydrogen atoms in the naphthyl group or alkyl-substituted naphthyl group with a hydroxyl group, carboxyl group, cyano group, nitro group, alkoxyl group, alkoxyalkyl group, alkoxycarbonyl group, or an alkoxycarbonyloxy.

Examples of an alkoxyl group, alkoxyalkyl group, alkoxycarbonyl group, and alkoxycarbonyloxy group which are substituents for the naphthyl group or alkyl-substituted naphthyl groups, the groups illustrated for the phenyl group and alkyl-substituted phenyl groups can be given.

A divalent group having from about 2 to about 10 carbon atoms is formed by two $R^{15}$ groups and can be a group which forms a 5- or 6-membered cyclic structure together with the sulfur atom in the formula, and particularly a group which forms a 5-membered cyclic structure (specifically, tetrahydrothiophene cyclic structure).

Examples of suitable substituent for the above identified divalent group, groups illustrated as suitable substituents for phenyl groups and alkyl-substituted phenyl groups, such as a hydroxyl group, carboxyl group, cyano group, nitro group, alkoxyl group, alkoxyalkyl group, alkoxycarbonyl group, and alkoxycarbonyloxy group are representative.

In particular, $R^{15}$ in the formula (5) can be a methyl group, ethyl group, or a phenyl group. A divalent group having a tetrahydrothiophene cyclic structure formed from two $R^{15}$ groups including a sulfur atom.

"q" in the formula (5) can be either 0 or 1.

The $C_aF_{2a+1}$ group in $F_{2a+1}SO_3^-$ represented by $Z^-$ in formula (5) is a perfluoroalkyl group having carbon atoms with a number "a", which may be either linear or branched.

"a" can be from about 4 to about 8.

Specific examples of the acid generator (5) include:
triphenylsulfonium trifluoromethanesulfonate, triphenylsulfonium nonafluoro-n-butanesulfonate, triphenylsulfonium perfluoro-n-octanesulfonate, 1-naphthyldimethylsulfonium trifluoromethanesulfonate, 1-naphthyldimethylsulfonium nonafluoro-n-butanesulfonate, 1-naphthyldimethylsulfonium perfluoro-n-octanesulfonate, 1-naphthyldiethylsulfonium trifluoromethanesulfonate, 1-naphthyldiethylsulfonium nonafluoro-n-butanesulfonatei, 1-naphthyldiethylsulfonium perfluoro-n-octanesulfonate, 4-hydroxy-1-naphthyldimethylsulfonium trifluoromethanesulfonate, 4-hydroxy-1-naphthyldimethylsulfonium nonafluoro-n-butanesulfonate, 4-hydroxy-1-naphthyldimethylsulfonium perfluoro-n-octanesulfonate, 4-hydroxy-1-naphthyldiethylsulfonium trifluoromethanesulfonate, 4-hydroxy-1-naphthyldiethylsulfonium nonafluoro-n-butanesulfonate, 4-hydroxy-1-naphthyldiethylsulfonium perfluoro-n-octanesulfonate, 4-cyano-1-naphthyldimethylsulfonium trifluoromethanesulfonate, 4-cyano-1-naphthyldimethylsulfonium nonafluoro-n-butanesulfonate, 4-cyano-1-naphthyldimethylsulfonium perfluoro-n-octanesulfonate, 4-cyano-1-naphthyldiethylsulfonium trifluoromethanesulfonate, 4-cyano-1-naphthyldiethylsulfonium nonafluoro-n-butanesulfonate, 4-cyano-1-naphthyldiethylsulfonium perfluoro-n-octanesulfonate, 4-nitro-1-naphthyldimethylsulfonium trifluoromethanesulfonate, 4-nitro-1-naphthyldimethylsulfonium nonafluoro-n-butanesulfonate, 4-nitro-1-naphthyldimethylsulfonium perfluoro-n-octanesulfonate, 4-nitro-1-naphthyldiethylsulfonium trifluoromethanesulfonate, 4-nitro-1-naphthyldiethylsulfonium nonafluoro-n-butanesulfonate, 4-nitro-1-naphthyldiethylsulfonium perfluoro-n-octanesulfonate, 4-methyl-1-naphthyldimethylsulfonium trifluoromethanesulfonate, 4-methyl-1-naphthyldimethylsulfonium nonafluoro-n-butanesulfonate, 4-methyl-1-naphthyldimethylsulfonium perfluoro-n-octanesulfonate, 4-methyl-1-naphthyldiethylsulfonium trifluoromethanesulfonate, 4-methyl-1-naphthyldiethylsulfonium nonafluoro-n-butanesulfonate, 4-methyl-1-naphthyldiethylsulfonium perfluoro-n-octanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(4-n-butoxyphenyl)tetrahydrothiophenium trifluoromethanesulfonate, 1-(4-n-butoxyphenyl)tetrahydrothiophenium nonafluoro-n-butanesulfonate, 1-(4-n-butoxyphenyl)tetrahydrothiophenium perfluoro-n-octanesulfonate, 1-(4-hydroxynaphthalen-1-yl)tetrahydrothiophenium trifluoromethanesulfonate, 1-(4-hydroxynaphthalen-1-yl)tetrahydrothiophenium nonafluoro-n-butanesulfonate, 1-(4-hydroxynaphthalen-1-yl)tetrahydrothiophenium perfluoro-n-octanesulfonate, 1-(4-methoxynaphthalen-1-yl)tetrahydrothiophenium trifluoromethanesulfonate, 1-(4-methoxynaphthalen-1-yl)tetrahydrothiophenium nonafluoro-n-butanesulfonate, 1-(4-methoxynaphthalen-1-yl)tetrahydrothiophenium perfluoro-n-octanesulfonate, 1-(4-ethoxynaphthalen-1-yl)tetrahydrothiophenium trifluoromethanesulfonate, 1-(4-ethoxynaphthalen-1-yl)tetrahydrothiophenium nonafluoro-n-butanesulfonate, 1-(4-ethoxynaphthalen-1-yl)tetrahydrothiophenium perfluoro-n-octanesulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-methoxymethoxynaphthalen-1-yl)tetrahydrothiophenium trifluoromethanesulfonate, 1-(4-methoxymethoxynaphthalen-1-yl)tetrahydrothiophenium nonafluoro-n-butanesulfonate, 1-(4-methoxymethoxynaphthalen-1-yl)tetrahydrothiophenium perfluoro-n-octanesulfonate, 1-(4-ethoxymethoxynaphthalen-1-yl)tetrahydrothiophenium trifluoromethanesulfonate, 1-(4-ethoxymethoxynaphthalen-1-yl)tetrahydrothiophenium nonafluoro-n-butanesulfonate, 1-(4-ethoxymethoxynaphthalen-1-yl)tetrahydrothiophenium perfluoro-n-octanesulfonate, 1-[4-(1☐methoxyethoxy)naphthalen-1-yl]-tetrahydrothiophenium trifluoromethanesulfonate, 1-[4-(1-methoxyethoxy)naphthalen-1-yl]tetrahydrothiophenium nonafluoro-n-butanesulfonate, 1-[4-(1-methoxyethoxy)naphthalen-1-yl]tetrahydrothiophenium perfluoro-n-octanesulfonate, 1-[4-(2☐methoxyethoxy)naphthalen-1-yl]-tetrahydrothiophenium trifluoromethanesulfonate, 1-[4-(2-methoxyethoxy)naphthalen-1-yl]tetrahydrothiophenium nonafluoro-n-butanesulfonate, 1-[4-(2-methoxyethoxy)naphthalen-1-yl]tetrahydrothiophenium perfluoro-n-octanesulfonate, 1-(4-methoxycarbonyloxynaphthalen-1-yl)-tetrahydrothiophenium trifluoromethanesulfonate, 1-(4-methoxycarbonyloxynaphthalen-1-yl)-tetrahydrothiophenium nonafluoro-n-butanesulfonate, 1-(4-methoxycarbonyloxynaphthalen-1-yl)-tetrahydrothiophenium perfluoro-n-octanesulfonate, 1-(4-ethoxycarbonyloxynaphthalen-1-yl)-tetrahydrothiophenium trifluoromethanesulfonate, 1-(4-ethoxycarbonyloxynaphthalen-1-yl)tetrahydrothiophenium nonafluoro-n-butanesulfonate, 1-(4-ethoxycarbonyloxynaphthalen-1-yl)tetrahydrothiophenium perfluoro-n-octanesulfonate, 1-(4-n-propoxycarbonyloxynaphthalen-1-yl)-tetrahydrothiophenium trifluoromethanesulfonate, 1-(4-n-propoxycarbonyloxynaphthalen-1-yl)-tetrahydrothiophenium nonafluoro-n-butanesulfonate, 1-(4-n-propoxycarbonyloxynaphthalen-1-yl)-tetrahydrothiophenium perfluoro-n-octanesulfonate, 1-(4-i-propxycarbonyloxynaphthalen-1-yl)-tetrahydrothiophenium trifluoromethanesulfonate, 1-(4-i-propxycarbonyloxynaphthalen-1-yl)-tetrahydrothiophenium nonafluoro-n-butanesulfonate, 1-(4-i-propxycarbonyloxynaphthalen-1-yl)-tetrahydrothiophenium perfluoro-n-octanesulfonate, 1-(4-n-butoxycarbonyloxynaphthalen-1-yl)-tetrahydrothiophenium trifluoromethanesulfonate, 1-(4-n-butoxycarbonyloxynaphthalen-1-yl)-tetrahydrothiophenium nonafluoro-n-butanesulfonate, 1-(4-n-butoxycarbonyloxynaphthalen-1-yl)-tetrahydrothiophenium perfluoro-n-octanesulfonate, 1-(4-t- butoxycarbonyloxynaphthalen-1-yl)-tetrahydrothiophenium trifluoromethanesulfonate, 1-(4-t-butoxycarbonyloxynaphthalen-1-yl)-tetrahydrothiophenium nonafluoro-n-butanesulfonate, 1-(4-t-butoxycarbonyloxynaphthalen-1-yl)-tetrahydrothiophenium perfluoro-n-octanesulfonate, 1-(4-benzyloxynaphthalen-1-yl)tetrahydrothiophenium trifluoromethanesulfonate, 1-(4-benzyloxynaphthalen-1-yl)tetrahydrothiophenium nonafluoro-n-butanesulfonate, 1-(4-benzyloxynaphthalen-1-yl)tetrahydrothiophenium perfluoro-n-octanesulfonate, 1-(2-naphthalen-1-yl-2-oxoethyl)tetrahydrothiophenium trifluoromethanesulfonate, 1-(2-naphthalen-1-yl-2-oxoethyl)tetrahydrothiophenium nonafluoro-n-butanesulfonate, and 1-(2-naphthalen-1-yl-2-oxoethyl)tetrahydrothiophenium perfluoro-n-octanesulfonate, 1-[4-(2-tetrahydrofuranyloxy)naphthalen-1-yl]-tetrahydrothiophenium trifluoromethanesulfonate, 1-[4-(1-tetrahydrofuranyloxy)naphthalen-1-yl]-tetrahydrothiophenium nonafluoro-n-butanesulfonate, 1-[4-(2-tetrahydrofuranyloxy)naphthalen-1-yl]-tetrahydrothiophenium perfluoro-n-octanesulfonate, 1-[4-(2-tetrahydropyranyloxy)naphthalen-1-yl] tetrahydrothiophenium trifluoromethanesulfonate, 1-[4-(2-tetrahydropyranyloxy)naphthalen-1-yl]-tetrahydrothiophenium nonafluoro-n-butanesulfonate, and 1-[4-(2-tetrahydropyranyloxy)naphthalen-1-yl]-tetrahydrothiophenium perfluoro-n-octanesulfonate.

In particular, photo-acid generators (5) include triphenylsulfonium nonafluoro-n-butanesulfonate, triphenylsulfonium perfluoro-n-octanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(4-hydroxynaphthalen-1-yl)tetrahydrothiophenium nonafluoro-n-butanesulfonate, 1-(4-hydroxynaphthalen-1-yl)tetrahydrothiophenium perfluoro-n-octanesulfonate, 1-(4-n-butoxynaphthalen-1-yl)tetrahydrothiophenium nonafluoro-n-butanesulfonate, 1-(4-n-butoxynaphthalen-1-yl) tetrahydrothiophenium perfluoro-n-octanesulfonate, 1-(2-naphthalen-1-yl-2-oxoethyl)tetrahydrothiophenium nonafluoro-n-butanesulfonate, 1-(2-naphthalen-1-yl-2-oxoethyl)tetrahydrothiophenium perfluoro-n-octanesulfonate, and the like.

Examples of acid generators other than the acid generators having formula (5) (hereinafter referred to as "other acid generators") include onium salt compounds, halogen-containing compounds, diazoketone compounds, sulfone compounds, sulfonate compounds, and the like.

Examples of these other acid generators are given below:

Onium Salt:

Examples of onium salts include iodonium salts, sulfonium salts, phosphonium salts, diazonium salts, and pyridinium salts.

Specific examples of onium salt include: diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, cyclohexyl•2-oxocyclohexyl•methylsulfonium trifluoromethanesulfonate, dicyclohexyl•2-oxocyclohexylsulfonium trifluoromethanesulfonate, and 2-oxocyclohexyldimethylsulfonium trifluoromethanesulfonate.

Halogen-Containing Compounds:

Examples of halogen-containing compounds include haloalkyl group-containing hydrocarbon compounds, and haloalkyl group-containing heterocyclic compounds.

Specific examples of halogen-containing compounds include (trichloromethyl)-s-triazine derivatives such as phenylbis(trichloromethyl)-s-triazine, 4-methoxyphenylbis (trichloromethyl)-s-triazine, and 1-naphthylbis(trichloromethyl)-s-triazine, and 1,1-bis(4-chlorophenyl)-2,2,2-trichloroethane.

Diazoketone Compounds:

Examples of diazoketone compounds include 1,3-diketo-2-diazo compounds, diazobenzoquinone compounds, and diazonaphthoquinone compounds.

Examples of diazoketone compounds include 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, and 1,2-naphthoquinonediazido-4-sulfonate and 1,2-naphthoquinonediazido-5-sulfonate of 1,1,1-tris(4-hydroxyphenyl)ethane.

Sulfone Compound:

Examples of sulfone compounds, include ketosulfones, sulfonylsulfones, and diazo compounds of these compounds.

Specific examples of sulfone compounds include 4-trisphenacylsulfone, mesitylphenacylsulfone, bis(phenylsulfonyl)methane, and the like.

Sulfonate Compounds:

Examples of sulfonate compounds include alkyl sulfonate, alkylimide sulfonate, haloalkyl sulfonate, aryl sulfonate, and imino sulfonate.

Specific examples of sulfone compound include benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarboxyimide, nonafluoro-n-butanesulfonylbicyclo[2.2.1]-hept-5-ene-2,3-dicarboxyimide, perfluoro-n-octanesulfonylbicyclo [2.2.1]-hept-5-ene-2,3-dicarboxyimide, N-hydroxysuccinimidetrifluoromethanesulfonate, N-hydroxysuccinimidenonafluoro-n-butanesulfonate, N-hydroxysuccinimideperfluoro-n-octanesulfonate, 1,8-naphthalenedicarboxylic acid imide trifluoromethanesulfonate, 1,8-naphthalenedicarboxylic acid imide nonafluoro-n-butanesulfonate, and 1,8-naphthalenedicarboxylic acid imide perfluoro-n-octanesulfonate.

Of these acid generators, the following compounds are of particular interest: diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, cyclohexy•2-oxocyclohexyl•methylsulfonium trifluoromethanesulfonate, dicyclohexyl•2-oxocyclohexylsulfonium trifluoromethanesulfonate, 2-oxocyclohexyldimethylsulfonium trifluoromethanesulfonate, trifluoromethanesulfonylbicyclo[2.2.1]hept-5-ene-2,3-dicarboxyimide, nonafluoro-n-butanesulfonylbicyclo[2.2.1] hept-5-ene-2,3-dicarboxyimide, perfluoro-n-octanesulfonylbicyclo[2.2.1]hept-5-ene-2,3-dicarboxyimide, N-hydroxysuccinimido trifluoromethanesulfonate, N-hydroxysuccinimido nonafluoro-n-butanesulfonate, N-hydroxysuccinimido perfluoro-n-octanesulfonate, and 1,8-naphthalenedicarboxylic acid imide trifluoromethanesulfonate.

In the photoresist composition, the acid generator (B) can be used either individually or in combination with two or more acid generators.

In the photoresist compositions of the invention, the amount of acid generator (B) is usually between about 0.1 to about 20 parts by weight, and more particularly between about 0.5 and about 10 parts by weight for 100 parts by weight of polymeric resin (A) or 100 parts by weight of the mixture of the resin (A1) and the resin (A2) in order to ensure sensitivity and developability of the photoresist. If the amount of the acid generator (B) is less than about 0.1 part by weight, sensitivity and developability of the resulting resist may be decreased. If the amount of acid generator exceeds 20 parts by weight, it may be difficult to obtain a rectangular resist pattern due to a decrease in transparency of the photoresist composition to radiation.

Additives

Various types of additives such as acid diffusion controllers, alicyclic additives having an acid-dissociating group, surfactants, and sensitizers can optionally be added to the radiation-sensitive polymeric resin photoresist composition of the present invention.

Acid diffusion controllers control the diffusion phenomenon of an acid generated from the acid generator (B) upon exposure in the photoresist film composition, thereby hindering undesired chemical reactions in an unexposed area.

Addition of an acid diffusion controller further improves storage stability of the resulting radiation-sensitive resin photoresist composition and resolution of the resist. Moreover, addition of the acid diffusion controller helps to prevent the line width of the resist pattern from changing due to changes in the post-exposure delay (PED) between exposure and development, whereby a composition with remarkably superior process stability can be obtained.

As an acid diffusion controller, nitrogen-containing organic compounds where the basicity of the compound does not change during exposure or heating for forming a resist pattern are preferable.

Examples of such nitrogen-containing organic compounds, include those compounds of the following formula (6) (hereinafter called "nitrogen-containing compound (a)"):

$N(R^{16})_3$ wherein each $R^{16}$, individually, can be a hydrogen atom, a substituted or unsubstituted, linear, branched, or cyclic alkyl group, substituted or unsubstituted aryl group, or substituted or unsubstituted aralkyl group, a compound having two nitrogen atoms in a molecule (hereinafter referred to as "nitrogen-containing compound (b)"); polyamino compounds and polymers having three or more nitrogen atoms in the molecule (hereinafter collectively referred to as "nitrogen-containing compound (c)"); and amide group-containing compounds, urea compounds, and other nitrogen-containing heterocyclic compounds.

Examples of nitrogen-containing compound (a) include mono(cyclo)alkylamines, such as n-hexylamine, n-heptylamine, n-octylamine, n-nonylamine, n-decylamine, and cyclohexylamine; di(cyclo)alkylamines, such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo) alkylamines, such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and aromatic amines, such as aniline, N-methylaniline, N,N-dimethylaniline, 2-methylaniline, 3-methylaniline, 4-methylaniline, 4-nitroaniline, diphenylamine, triphenylamine, and naphthylamine.

Examples of the nitrogen-containing compound (b) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, and bis(2-diethylaminoethyl)ether.

Examples of nitrogen-containing compounds (c) include polyethyleneimine, polyallylamine, and a polymer of 2-dimethylaminoethylacrylamide.

Examples of amide group-containing compounds include N-t-butoxycarbonyl group-containing amino compounds, such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, formamide, N-methylformamide, N,N-dimethylformamide, acetamide, N-methylacetamide, N,N-dimethylacetamide, propionamide, benzamide, pyrrolidone, and N-methylpyrrolidone Examples of urea compounds include urea, methylurea, 1,1-dimethylurea, 1,3-dimethylurea, 1,1,3,3-tetramethylurea, 1,3-diphenylurea, and tri-n-butylthiourea.

Examples of nitrogen-containing heterocyclic compounds include: imidazoles, such as imidazole, 4-methylimidazole, 4-methyl-2-phenylimidazole, benzimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine and 1-(2-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane.

Of the nitrogen-containing organic compounds, the nitrogen-containing compounds (a), amide group-containing compounds, nitrogen-containing heterocyclic compounds are of particular interest.

The acid diffusion controllers can be used either individually or as a mixture of two or more.

The alicyclic additives having an acid-dissociable group improve dry etching resistance, pattern shape, and adhesion to a substrate.

Examples of such alicyclic additives include:

adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, and di-t-butyl 1,3-adamantanediacetate; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; and lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate.

The alicyclic additives can be used either individually or as a mixture of two or more.

Surfactants often improve applicability, striation, developability, and the like.

Suitable examples of surfactants include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; and commercially available products such as KP341 (manufactured by Shin-Etsu Chemical Co., Ltd.), POLYFLOW No. 75, No. 95 (manufactured by Kyoeisha Chemical Co., Ltd.), FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.).

The surfactants can be used either individually or as a mixture of two or more.

Sensitizers absorb radiation energy and transmit the energy to the acid generator (B), thereby increasing the amount of an acid to be generated upon exposure. Sensitizers, therefore, improve apparent sensitivity of the radiation-sensitive resin composition.

Examples of sensitizers include acetophenones, benzophenones, naphthalenes, biacetyl, Eosine, Rose Bengal, pyrenes, anthracenes, and phenothiazines, and the like.

The sensitizers can be used either individually as a mixture of two or more.

Addition of dyes or pigments helps to visualize a latent image in the exposed area, thereby decreasing the effects of halation during exposure. Use of adhesion improvers improves adhesion to the substrates.

As other additives, alkali-soluble resins described later, low molecular weight alkali solubility controllers containing an acid dissociable protecting group, halation inhibitors, preservation stabilizers, antifoaming agents, and the like are considered within the scope of the invention.

Preparation of Composition Solution:

The radiation-sensitive photoresist resin composition of the present invention is made into a composition solution by dissolving the photoresist composition in a solvent so that the total solid content is usually between about 5 to about 50 wt %, and preferably between about 10 to about 25 wt %, and filtering the solution using a filter with a pore diameter of about 0.2 μm, for example.

Examples of solvents useful for preparation of the photoresist composition solution include linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, 2-hydroxy-2-methylethyl propionate, ethyl ethoxyacetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methylpyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, gamma-butyrolactone, ethylene carbonate, and propylene carbonate.

The solvent can be used either individually or as a mixture of two or more.

Use of a linear or branched ketone, cyclic ketone, propylene glycol monoalkyl ether acetate, alkyl 2-hydroxypropionate, alkyl 3-alkoxypropionate, gamma-butyrolactone, or the like is particularly suitable.

Formation of Resist Pattern

The radiation-sensitive photoresist resin composition of the present invention is useful as a chemically-amplified resist.

In the chemically-amplified resist, an acid-dissociable group in the resin (A) dissociates by the action of an acid generated from the acid generator (B) upon exposure to energy, thereby producing a carboxyl group. As a result, solubility of the exposed part of the resist in an alkaline developer increases, whereby the exposed part is dissolved in an alkaline developer and removed to produce a positive-tone resist pattern.

A resist pattern is formed from the radiation-sensitive photoresist resin composition of the present invention by applying the photoresist composition solution to, for example, a substrates such as a silicon wafer or a wafer coated with aluminum using an appropriate application method such as rotational coating, cast coating, and roll coating to form a resist film. The resist film is then optionally pre-baked (hereinafter called "PB") and exposed to form a predetermined resist pattern. As radiation used for exposure, visible rays, ultraviolet rays, deep ultraviolet rays, X-rays, electron beams, or the like is appropriately selected depending on types of the acid generator (B). It is particularly preferable to use deep ultraviolet rays such as an ArF excimer laser (wavelength: 193 nm), KrF excimer laser (wavelength: 248 nm), and $F_2$ excimer laser (wavelength: 157 nm).

In the present invention, it is preferable to perform a post-exposure bake (hereinafter called "PEB"). The PEB enables smooth dissociation of the acid-dissociable group. The heating temperature for the PEB is usually between about 30 and about 200° C., and preferably from between about 50 and about 170° C., although the heating conditions can be changed depending on the composition of the radiation-sensitive resin composition.

In order to bring out maximum potentiality of the radiation-sensitive resin composition of the present invention, an organic or inorganic anti-reflection film may be formed on a substrate as disclosed in Japanese Patent Publication No. 1994-12452, for example. Moreover, a protection film may be formed on the resist film as disclosed in Japanese Patent Publication No. 1993-188598 or the like in order to prevent the effects of basic impurities and the like in an environmental atmosphere. These techniques may be employed in combination.

The exposed resist film is then developed using an alkaline developer to form a predetermined resist pattern.

Examples of an alkali developer used for development include an alkaline aqueous solution prepared by dissolving at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene in water.

The concentration of the alkaline aqueous solution is generally from about 10 wt % or less. If the concentration of the alkaline aqueous solution exceeds 10 wt %, an unexposed part may be dissolved in the developer.

Organic solvents can be added to the alkaline aqueous solution.

Suitable examples of organic solvents useful in the developing solution include ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone and dimethylformamide.

The organic solvents can be used either individually or as mixtures of two or more.

The amount of the organic solvent to be used is preferably 100 vol % or less of the alkaline aqueous solution. If the amount of the organic solvent exceeds 100 vol %, the exposed part may remain undeveloped due to a decrease in developability.

A surfactant can be added to the alkaline aqueous solution.

The resist film is generally washed with water after development using the alkaline aqueous solution.

EXAMPLES

Polymer Synthesis

Procedure for the Living Polymerization of Methacrylate and Acrylate Monomers Encompassed by the Invention The following is a general procedure for use with a CTA. (See Table I, column C) for the polymerization of monomers to form a polymer with the desired nominal compositions (Table I, column H) and targeted to have different molecular weights (Mw) at 100% conversion. The polymerization was conducted in an organic solvent, i.e., MEK (2-butanone) (which was degassed by three freeze-pump-thaw cycles) and the initiator MAIB (V601 from WAKO, 2,2'-dimethylazobis (methylpropionate)) was used to sustain the reaction. The stock solutions were made by weighing the monomers, CTA and initiator followed by cycling with vacuum into an oxygen free box where purified MEK was added.

Similar conditions can be used for other comonomer mixtures and with other CTAs. Target molecular weight is set as a molar ratio of the monomers to the CTA. The feed time can also be varied (Table I, column G). Feed times effect the target molecular weight, the polymer composition (due to reactivity ratios and the subsequent monomer drift) as well as the PDI.

For example, reaction conditions for CTA H-AB-1 with acrylates generally require a three hour feed time followed by six hours of continued heating at 65° C. In contrast, reaction conditions for CTA H-T-3 with methacrylates generally require six hours feed time followed by two hours of continued heating at 80° C.

Example to Prepare a Polymer with a Nominal Composition N1/P1/Q1(50/35/15) and Mw Targeted at 6000 g/mol at 100% Conversion Using CTA-HT3 as Controlling Agent Stock Solutions (ss) are:
1) "Monomer Mixture": 17.830 g N1+16.708 g P1+6.315 g Q1+145 mL MEK
2) "MAIB Solution": 1.271 g MAIB+30 mL MEK
3) "CTA Solution": 1.417 g CTA-H-T-3+7.044 mL MEK to get 8.804 mL of stock solution
4) "MEK" (pure): 29.150 mL MEK Reaction:
1) A 500 mL glass reaction flask equipped with a magnetic stir bar and a reflux condenser was cycled into the glove box.
2) All of "CTA Solution" (8.804 mL), and all of the "MEK" were added to the reaction flask, as well as 1.918 mL of "MAIB Solution" and 19.285 mL of "Monomer Mixture" (10% of each of these solutions).
3) The reaction flask was then removed from the glove box and the mixture was degassed by three freeze-pump-thaw cycles, followed by backfilling of the system with high purity nitrogen or argon (and left under a bubbler of inert gas).
4) The "Monomer Mixture" and "MAIB Solution" were then primed on two feed pumps which were then attached to the reaction flask. (The sealed bottles of the two stock solutions were placed under an inert gas bubbler.)
5) The flask was the submerged into an oil bath at 85° C. and stirring was set at 400 rpm.
6) Once the reaction mixture reached 85° C., the semicontinuous addition of 173.57 mL of "Monomer Mixture" and 17.27 mL of "MAIB Solution" was begun, and added over the next six hours in a series of 100 equal volume injections while maintaining an internal temperature of 85° C.
7) Heating of the reaction mixture at 85° C. was continued for an additional two hours past the end of the feed.
8) The reactor was then cooled to room temperature (approximately 45-50 minutes). The reaction mixture was concentrated by removing half of the solvent (MEK). The mixture was then precipitated slowly into 2 L of isopropanol, washed with an additional 500 mL of isopropanol, and dried under vacuum at 45° C. for two days.
9) 35.2 g of dry polymer was isolated with an Mw=6200 g/mol, and a PDI=1.30 (sample 11693911). Other samples were prepared in similar fashion with an isolation of polymer ranging from 0.5 grams to 50 grams yield after precipitation.

Example to Prepare a Polymer with a Nominal Composition N2/P5/Q3(55/35/10) and Mw Targeted at 15000 g/mol at 100% Conversion Using CTA-HAB1 as Controlling Agent.

Stock Solutions (ss) are:

1) "Monomer Mixture": 20.95 g N2+18.86 g P5+4.47 g Q3+110 mL MEK
2) "MAIB Solution": 0.636 g MAIB+15 mL MEK
3) "CTA Solution": 0.763 g CTA-H-AB-1+3.79 mL MEK
4) "MEK" (pure): 91 mL MEK Reaction:

5) A 500 mL glass reaction flask equipped with a magnet stir bar and a reflux condenser was cycled into the glove box.
6) All of "CTA Solution", and all of the "MEK" were added to the reaction flask, as well as 0.461 mL of "MAIB Solution" and 15.0 mL of "Monomer Mixture" (10% of each of these solutions).
7) The reaction flask was then removed from the glove box and the mixture was degassed by three freeze-pump-thaw cycles, followed by backfilling of the system with high purity nitrogen or argon (and left under a bubbler of inert gas).
8) The "Monomer Mixture" and "MAIB Solution" were then primed on two feed pumps which were then attached to the reaction flask. (The sealed bottles of the two stock solutions were placed under inert gas bubbler.)
9) The flask was the submerged into an oil bath at 70° C. and stirring was set at 400 rpm.
10) Once the reaction mixture reached 65° C., the semi-continuous addition of 135 mL of "Monomer Mixture" and 4.145 mL of "MAIB Solution" was begun, and added over the next three hours in a series of 100 equal volume injections while maintaining an internal temperature of 65° C.
11) Heating of the reaction mixture at 65° C. was continued for an additional three hours past the end of the feed.
12) The reactor was then cooled to room temperature (approximately 45-50 minutes) and the reaction mixture was precipitated slowly into 2 L of isopropanol, washed with an additional 500 mL of isopropanol, and dried under vacuum at 45° C. for two days.
13) 26 g of dry polymer was isolated with an Mw=6900, and a PDI=1.35 (sample 11692711 (A4)). Other samples were prepared in similar fashion with an isolation of polymer ranging from 0.5 grams to 50 grams yield after precipitation.

Example to Prepare Polymers with a Nominal Composition N1/P1/Q1(50/35/15) at Different Molecular Weights Using CTA-HT3 as Controlling Agent in a Library Format (116959)

Stock Solutions (ss) were prepared in an inert atmosphere and are typically:

1) "Monomer Mixture": 17.215 g N1+16.13 g P1+6.097 g Q1+140 mL MEK
2) "MAIB Solution": 1.896 g MAIB+50 mL MEK
3) "CTA Solution": 1.242 g CTA-H-T-3+3.6 mL MEK to get 5.143 mL of stock solution
4) "MEK" (pure): 29.150 mL MEK Reaction:

5) All of "CTA Solution" (ss-CTA-HT3) was preliminary equally added to 24 individual reactor vessels of a Semi-Continuous Parallel Pressurized Reactor (Table 3, "ss-CTA-HTs).
6) Three individuals lines (2,3 and 4) were respectively primed with solvent (MEK), ss-MAIB and monomer solution before sealing of the reactor vessels.
7) The reactor vessels were degassed by a pressurization, pressure relieve and backfilling under inert-cycles with high purity argon.
8) Solutions dispensed in each of the 24 reactor vessels were mentioned in Table 3 (in µL). All of the "MEK" (Line 2) was added to the reactions flasks, as well as 10% of "ss-MAIB Solution" (Line 3) and "ss-Monomer Mixture" (Line 4).
9) The temperature was set at 80° C. and stirring was set at 400 rpm.
10) Once the reaction mixture reached 79° C., semi-continuous addition of the remaining "Monomer Mixture" (line 4) and "MAIB Solution" (line 3) was begun, and added over the next six hours in a series of 100 equal volume injections while maintaining an internal temperature of 80° C.
11) Heating of the reaction mixture at 80° C. was continued for an additional two hours past the end of the feed.
12) The reactor vessels were left for cooling to room temperature and opened to collect solutions. The reaction mixtures were concentrated so that half of the solvent (MEK) is removed.

Example to Prepare Polymers with a Nominal Composition N1/P1/Q1 (50/35/15) at Different Molecular Weights Using CTA-HT3 as Controlling Agent in a Library Format (116964)

Stock Solutions are repared in an inert atmosphere and are:

1) "Monomer Mixture": 16.506 g N1+15.466 g P1+5.846 g Q1+80 mL MEK
2) "MAIB Solution": 2.388 g MAIB+30 mL MEK to get 32.967 mL of stock solution.
3) "CTA Solution": 1.300 g CTA-H-T-3+3 mL MEK to get 4.615 mL of stock solution.
4) "MEK" (pure): 11.776 mL MEK Reaction:

5) All of "CTA Solution" (ss-CTA-HT3) were preliminary added to 8 reactor vessels of a Semi-Continuous Parallel Pressurized Reactor (Table 5, ss-CTA-HT3).
6) Three individuals lines (2, 3 and 4) were respectively primed with solvent (MEK), ss-MAIB and the methacrylate stock solution (ss-methacrylate) before sealing the reactor vessels.
7) The reactor vessels were degassed by a pressurization, pressure relieve and backfilling under inert-cycles with high purity argon.
8) Solutions dispensed in each of the 8 reactor vessels are identified in table 5 (in microliters). All of the "MEK" (Line 2) was added to the reactor vessels, as well as 10% of ss-MAIB (Line 3) and "ss-methacrylate" (line 4).
9) The temperature was set at 80° C. and stirring was set at 400 rpm.
10) Once the reaction mixture reached 79° C., the semi-continuous addition of the remaining "Monomer Mixture" (line 4) and "MAIB Solution" (line 3) was begun, and added over the next six hours in a series of 100 equal volume injections while maintaining an internal temperature of 80° C.
11) Heating of the reaction mixture at 80° C. was continued until the end of the reaction.
12) The reactor vessels were left for cooling to room temperature and opened to collect solutions. The reaction mixtures were concentrated by removing half of the solvent (MEK). Physical results of isolated polymer are shown in Tables 5 and 6 for 116964.

Preparation of Sample B 15 (11695004) with a
Nominal Composition N1/Q1/P6 (45/15/40)
Targeting Mw=8,500 g/mol at 100% Conversion
Using CTA-HAB1 as Controlling Agent in a Library
Format Stock Solutions prepared for the whole library 116950 involving B15
1) Monomer Mixture "ss-B15": 3.82963 g N1+1.357287 g Q1+2.576706 g P6 in 30 mL MEK.
2) "MAIB Solution": 1.906579 g MAIB+45 mL MEK
3) "CTA Solution": 284.118 mg CTA-H-AB-1+2 mL MEK
4) "MEK" (pure): 55.559 mL MEK
For vial 11695004, volumes to be dispensed were:
1) "ss-B15": 6577.054 uL
2) "MAIB Solution": 433.4494 uL
3) "CTA-HAB1": 341.8227 uL
4) "MEK": 647.6735 uL
Reaction Conditions:
1) CTA Solutions (341.8 uL of "CTA-HAB1" in vial 4) were preliminary added to reactor vessels of Symyx's Semi continuous Parallel Polymerization Reactor (SCPPR).
2) Lines of the reactor were respectively primed with solvent, MAIB and methacrylate solutions before sealing.
3) Vials are degassed by a pressurization, pressure relieve and backfilling under inert-cycles with high purity argon.
4) Solutions were dispensed for the synthesis of 11695004 as identified above. All of the "MEK" (647.6735 uL) was added to the reaction flask, as well as 10% of "MAIB Solution" (43.34 uL) and 10% of "Monomer Mixture" (657.70 uL).
5) The temperature was set at 80° C., stirring was set at 400 rpm and reactors pressurized at 120 psi.
6) Once the reaction mixture reached 79° C., the semi continuous addition of the remaining "Monomer Mixture" (line 4) and "MAIB Solution" (line 3) was begun, and added over the next six hours while maintaining an internal temperature of 80° C.
7) Heating of the reaction mixture at 80° C. was continued for an additional two hours past the end of the feed.
8) The reactors were left for cooling to room temperature and opened to collect solutions.

9) After precipitation into ispropanol, about 880 mg of polymer was collected (70% of yield after precipitation). Narrow calibration GPC gave Mw # 7,000 g/mol and PDI # 1.17. Conventional GPC gave Mw # 7,000 g/mol and PDI # 1.29.

Polymerization Processes (G) for Tables 1, 2, 3, 4, 5 and 6:

1: 10% of radical source (ss MAIB, V601, MAIB) and 10% of monomer loaded initially, 3 hours of feeding (100 injections) followed by 6 hours of reaction 2: 10% of radical source (ss-MAIB, V601) and 10% of monomer loaded initially 6 hours of feeding (100 injections) followed by 2 hours of reaction 3: 10% of radical source (ss-MAIB, V601) and 10% of monomer loaded initially followed by 5 hours of feeding (100 injections) only 4: 10% of radical source (ss-MAIB, V601) and 10% of monomer loaded initially followed by 12 hours of feeding (100 injections) only 5: 10% of radical source (ss-MAIB, V601) and 10% of monomer loaded initially 3 hours of feeding (100 injections) followed by 2 hours of reaction 6: polymers were dissolved in MEK (20% w/w) in the presence of 4 equivalents of radical source (AIBN, Lauroyl peroxide or MAIB) and heated at 85° C. for 1 h. Polymer is then purified by precipitation into isopropanol.

7: batch process polymerization for 3 h at 80 C

8: feeding was performed over a period of 7 h followed by an additional hour of reaction.

9: batch process polymerization for 8 h at 80 C

10: feeding was performed over a period of 8 h

11: 10% of radical source (ss-MAIB) and 10% of monomer loaded initially, 9 hours of feeding (100 injections) followed by 3 hours of reaction 12: 10% of radical source (ss-MAIB) and 10% of monomer loaded initially followed by a continuous feeding (100 injections) during 8 hours.

13: 10% of radical source (ss-MAIB) and 10% of monomer loaded initially, 15 hours of feeding (100 injections) followed by 5 hours of reaction 14: 10% of radical source (ss-MAIB) and 10% of monomer loaded initially, followed by a continuous feeding (100 injections) during 20 hours.

15: 10% of radical source (ss-MAIB) and 10% of monomer loaded initially, 3 hours of feeding (100 injections) followed by 1 hour of reaction

TABLE 1

| | | | | | | Targeted | | |
|---|---|---|---|---|---|---|---|---|
| | | | MAIB/ | | | Mw at | | |
| Reference (A) | Sample # (B) | CTA (C) | CTA (D) | Cleavage (E) | Temperature (F) | 100% conversion | Process (G) | Targeted composition (H) |
| 11692711 | A4 | HT7 | 0.3 | — | 60 | 7000 | 1 | N2: 55 |
| | | | | | | | | P5: 35 |
| | | | | | | | | Q3: 10 |
| 11692712 | A5 | HT7 | — | lauroyl peroxide | 80 | 7000 | 6 | N2: 55 |
| | | | | | | | | P5: 35 |
| | | | | | | | | Q3: 10 |
| 11693911 | A1 | HT3 | 0.5 | — | 80 | 6000 | 2 | N1: 50 |
| | | | | | | | | P1: 35 |
| | | | | | | | | Q1: 15 |
| 11694211 | A2 | HT3 | — | lauroyl peroxide | 80 | 6000 | 6 | N1: 50 |
| | | | | | | | | P1: 35 |
| | | | | | | | | Q1: 15 |

TABLE 1-continued

Polymerization Process Conditions

| Reference (A) | Sample # (B) | CTA (C) | MAIB/ CTA (D) | Cleavage (E) | Temperature (F) | Targeted Mw at 100% conversion | Process (G) | Targeted composition (H) |
|---|---|---|---|---|---|---|---|---|
| 11342201 | A2b | HT3 | — | MAIB | 65 | 6000 | 6 | N1: 50<br>P1: 35<br>Q1: 15 |
| 11342202 | A2c | HT3 | — | AIBN | 80 | 6000 | 6 | N1: 50<br>P1: 35<br>Q1: 15 |
| 11693316 | B4 | HAB1 | 0.3 | — | 80 | 12000 | 3 | N2: 55<br>P5: 35<br>Q3: 10 |
| 11692003 | B6 | HT7 | — | lauroyl peroxide | 65 | 20000 | 6 | N2: 55<br>P5: 35<br>Q3: 10 |
| 11693320 | B6b | HAB1 | 0.3 | — | 65 | 20000 | 1 | N2: 55<br>P5: 35<br>Q3: 10 |
| 11694001 | B1 | HT3 | 0.3 | — | 80 | 3000 | 4 | N1: 50<br>P1: 35<br>Q1: 15 |
| 11693012 | B3 | HT7 | — | lauroyl peroxide | 80 | 9000 | 6 | N1: 50<br>P1: 35<br>Q1: 15 |
| 11691323 | B3b | HT3 | 0.5 | — | 80 | 10000 | 2 | N1: 50<br>P1: 35<br>Q1: 15 |
| 11691305 | B3c | HT3 | 0.1 | — | 80 | 10000 | 5 | N1: 50<br>P1: 35<br>Q1: 15 |
| 11694501 | B7 | HT3 | 0.5 | — | 80 | 2400 | 2 | N1: 60<br>P1: 40 |
| 11694507 | B8 | HT3 | 0.5 | — | 80 | 6700 | 2 | N1: 60<br>P1: 40 |
| 11694515 | B9 | HT3 | 0.5 | — | 80 | 11000 | 2 | N1: 60<br>P1: 40 |
| 11695307 | B9b | HT3 | 0.5 | — | 80 | 13000 | 2 | N1: 60<br>P1: 40 |
| 11695308 | B9c | HT3 | 0.5 | — | 80 | 15000 | 2 | N1: 60<br>P1: 40 |
| 11695706 | B10 | HT3 | 0.5 | — | 80 | 12000 | 2 | N1: 60<br>P1: 40 |
| 11695010 | B11 | HT3 | 0.5 | — | 80 | 5500 | 2 | N1: 50<br>P2: 13<br>P1: 37 |
| 11695012 | B12 | HT3 | 0.5 | — | 80 | 8500 | 2 | N1: 50<br>P2: 13<br>P1: 37 |
| 11695701 | B12b | HT3 | 0.5 | — | 80 | 9000 | 2 | N1: 50<br>P2: 13<br>P1: 37 |
| 11695014 | B13 | HT3 | 0.5 | — | 80 | 5500 | 2 | N1: 60<br>P2: 10<br>P1: 30 |
| 11695015 | B14 | HT3 | 0.5 | — | 80 | 5000 | 2 | N1: 50<br>P2: 40<br>Q1: 10 |
| 11695004 | B15 | HAB1 | 0.4 | — | 80 | 7000 | 2 | N1: 50<br>P6: 40<br>Q1: 10 |
| 10639564 | | HT7 | 0.2 | — | 65 | 10000 | 7 | N2: 55<br>P5: 35<br>Q3: 10 |
| 11690741 | | HT7 | 0.2 | — | 65 | 10000 | 8 | N2: 55<br>P5: 35<br>Q3: 10 |
| 10639561 | | HT7 | 0.2 | — | 65 | 10000 | 7 | N1: 50<br>P1: 35<br>Q1: 15 |

TABLE 2

Physical Properties for Polymeric resins of Table 1

| | Conventional GPC | | Rapid calibration GPC | | $^1$H NMR |
|---|---|---|---|---|---|
| | Mw | PDI | Mw | PDI | composition |
| 11692711 | 6900 | 1.35 | 7000 | 1.30 | N2: 51<br>P5: 37<br>Q3: 12 |
| 11692712 | 7800 | 1.34 | 7500 | 1.25 | N2: 51<br>P5: 38<br>Q3: 11 |
| 11693911 | 6200 | 1.5 | 6300 | 1.32 | N1: 46<br>P1: nd<br>Q1: nd |
| 11694211 | 7400 | 1.29 | 7600 | 1.18 | N1: 46<br>P1: nd<br>Q1: nd |
| 11342201 | 6800 | 1.35 | 7404 | 1.23 | N1: 46<br>P1: nd<br>Q1: nd |
| 11342202 | 6500 | 1.36 | 7156 | 1.23 | N1: 46<br>P1: nd<br>Q1: nd |
| 11693316 | 4300 | 1.22 | 4500 | 1.16 | N2: 50<br>P5: 38<br>Q3: 12 |
| 11692003 | 12500 | 1.45 | 12400 | 1.28 | N2: 49<br>P5: 38<br>Q3: 13 |
| 11693320 | 10500 | 1.53 | 11000 | 1.24 | N2: 49<br>P5: 38<br>Q3: 13 |
| 11694001 | 3500 | 1.25 | 3600 | 1.31 | N1: 50<br>P1: nd<br>Q1: nd |
| 11693012 | 8700 | 1.4 | 8700 | 1.22 | N1: 48<br>P1: nd<br>Q1: nd |
| 11691323 | 7800 | 1.4 | 7800 | 1.28 | N1: 47<br>P1: nd<br>Q1: nd |
| 11691305 | 10300 | 1.51 | 10500 | 1.27 | N1: 46<br>P1: nd<br>Q1: nd |
| 11694501 | 3100 | 1.3 | 3500 | 1.27 | N1: 58<br>P1: 42 |
| 11694507 | 6500 | 1.57 | 6300 | 1.31 | N1: 59<br>P1: 41 |
| 11694515 | 9100 | 1.67 | 9100 | 1.39 | N1: 59<br>P1: 41 |
| 11695307 | 8900 | 1.35 | 9000 | 1.31 | N1: 58<br>P1: 42 |
| 11695308 | 10100 | 1.44 | 10000 | 1.28 | N1: 59<br>P1: 41 |
| 11695703 | 11700 | 1.75 | 12300 | 1.39 | N1: 59<br>P1: 41 |
| 11695010 | 5000 | 1.4 | 5500 | 1.19 | N1: nd<br>P2: nd<br>P1: nd |
| 11695012 | 7200 | 1.47 | 7200 | 1.29 | N1: nd<br>P2: nd<br>P1: nd |
| 11695701 | 8800 | 1.6 | 9000 | 1.31 | N1: nd<br>P2: nd<br>P1: nd |
| 11695014 | 5300 | 1.45 | 5500 | 1.28 | N1: nd<br>P2: nd<br>P1: nd |
| 11695015 | 4500 | 1.39 | 5300 | 1.25 | N1: nd<br>P2: nd<br>Q1: nd |
| 11695004 | 7000 | 1.29 | 7000 | 1.17 | N1: 43<br>P6: nd<br>Q1: nd |
| 11692005 | nd | nd | 8100 | 1.14 | N1: 46<br>P1: nd<br>Q1: nd |
| 11691705 | 6500 | 1.26 | 7100 | 1.14 | N2: 49<br>P5: 38<br>Q3: 13 |
| 10639564 | nd | nd | 3500 | 1.27 | N2: 59<br>P5: 32<br>Q3: 9 |
| 11690741 | nd | nd | 4600 | 1.13 | N2: 52<br>P5: 36<br>Q3: 13 |
| 10699561 | nd | nd | 36000 | 1.6 | N1: nd<br>P1: nd<br>Q1: nd | nd = not determined

Size Exclusion Chromatography was performed using an automated rapid GPC system for rapid screening (see WO 99/51980, incorporated herein by reference). An automated conventional GPC system was utilized for secondary screening. In the current setup N,N-dimethylformamide containing 0.1% of trifluoroacetic acid was used as an eluent for the rapid GPC system whereas THF was used for the conventional system and polystyrene-based columns. All of the molecular weight results obtained are relative to linear polystyrene standards. NMR was carried out using a Bruker spectrometer (300 MHz) with $CDCl_3$ (chloroform-d) as solvent.

Rapid calibration GPC utilized 3 columns (PLgel, 5 μm Mixed D 300×7.5 mm) THF 1.0 mL/min; detectors RI, UV 220 and 290 nm; Standard for calibration: EsiCal PS-2.

Conventional calibration GPC utilized 3 columns (PLgel, 10 μm Mixed-B 300×7.5 mm) THF 1.0 mL/min; detectors RI, UV 280 nm; Standard for calibration: EsiCal PS-1

TABLE 3

Volume of stock solutions (ss) in microliters, dispensed in an array format: Preparation of Polymeric Resins via Semi-continuous parallel polymerization reactions (SCPPR)

| Vial | 2-butanone Line 2 | ss-MAIB Line 3 | ss-methacrylate Line 4 | ss-CTA-HT3 |
|---|---|---|---|---|
| 1 | 88.36388 | 1364.563 | 6171.411 | 375.6622 |
| 2 | 958.4765 | 682.2815 | 6171.411 | 187.8311 |
| 3 | 1248.514 | 454.8543 | 6171.411 | 125.2207 |
| 4 | 1426.999 | 314.8991 | 6171.411 | 86.69128 |
| 5 | 88.36388 | 1364.563 | 6171.411 | 375.6622 |
| 6 | 958.4765 | 682.2815 | 6171.411 | 187.8311 |
| 7 | 1248.514 | 454.8543 | 6171.411 | 125.2207 |
| 8 | 1426.999 | 314.8991 | 6171.411 | 86.69128 |
| 9 | 88.36388 | 1364.563 | 6171.411 | 375.6622 |
| 10 | 958.4765 | 682.2815 | 6171.411 | 187.8311 |
| 11 | 1248.514 | 454.8543 | 6171.411 | 125.2207 |
| 12 | 1426.999 | 314.8991 | 6171.411 | 86.69128 |
| 13 | 88.36388 | 1364.563 | 6171.411 | 375.6622 |
| 14 | 958.4765 | 682.2815 | 6171.411 | 187.8311 |
| 15 | 1248.514 | 454.8543 | 6171.411 | 125.2207 |
| 16 | 1426.999 | 314.8991 | 6171.411 | 86.69128 |
| 17 | 88.36388 | 1364.563 | 6171.411 | 375.6622 |
| 18 | 958.4765 | 682.2815 | 6171.411 | 187.8311 |
| 19 | 1248.514 | 454.8543 | 6171.411 | 125.2207 |
| 20 | 1426.999 | 314.8991 | 6171.411 | 86.69128 |
| 21 | 88.36388 | 1364.563 | 6171.411 | 375.6622 |
| 22 | 958.4765 | 682.2815 | 6171.411 | 187.8311 |
| 23 | 1248.514 | 454.8543 | 6171.411 | 125.2207 |
| 24 | 1426.999 | 314.8991 | 6171.411 | 86.69128 |

TABLE 4 polymerization results with library 116959 at 80° C.
Polymerizations were all performed at 80° C., initial molar ratio
MAIB/CTA = 0.5, CTA-H-T-3 as a controlling agent with a targeted
composition in molar percent of 50% N1, 35% P1 and 15% Q1.
11698401 and 11698402 were performed in
schlenk tubes as a batch process.
Conversion was estimated by Raman Spectroscopy (measuring the
disappearance of vibration peak at 1600 cm$^{-1}$) and by
$^1$H NMR for 11698401 and 11698402 (% of NML).

| Reference (A) | Process (G) | Mw targeted | Conversion (%) | Mw | PDi |
|---|---|---|---|---|---|
| 11698401 | 9 | 3,000 | 90* | 4400 | 1.62 |
| 11698402 | 9 | 9,000 | 85* | 8800 | 1.57 |
| 11695901 | 2 | 3,000 | 86 | 3800 | 1.34 |
| 11695902 | 2 | 6,000 | 85 | 6000 | 1.35 |
| 11695903 | 2 | 9,000 | 81 | 7800 | 1.33 |
| 11695904 | 2 | 12,000 | 70 | 10500 | 1.3 |
| 11695905 | 10 | 3,000 | 92 | 3600 | 1.36 |
| 11695906 | 10 | 6,000 | 85 | 5700 | 1.32 |
| 11695907 | 10 | 9,000 | 75 | 7100 | 1.34 |
| 11695908 | 10 | 12,000 | 82 | 9700 | 1.27 |
| 11695909 | 11 | 3,000 | 94 | 3900 | 1.59 |
| 11695910 | * | | | | |
| 11695911 | * | | | | |
| 11695912 | * | | | | |
| 11695913 | 4 | 3,000 | 90 | 4670 | 1.61 |
| 11695914 | * | | | | |
| 11695915 | * | | | | |
| 11695916 | 4 | 12,000 | 43 | 10720 | 1.41 |
| 11695917 | 13 | 3,000 | 97 | 3500 | 1.33 |
| 11695918 | 13 | 6,000 | 97 | 6100 | 1.35 |
| 11695919 | 13 | 9,000 | 97 | 8000 | 1.39 |
| 11695920 | 13 | 12,000 | 92 | 10800 | 1.38 |
| 11695921 | 14 | 3,000 | 95 | 4300 | 1.4 |
| 11695922 | 14 | 6,000 | 93 | 5700 | 1.35 |
| 11695923 | 14 | 9,000 | 83 | 7200 | 1.36 |
| 11695924 | * | | | | |

* Mechanical failure, no result
11698401 and 11698402 were prepared in a batch process

TABLE 5

Volume of the stock solutions (in uLdispensed in an array format using SCPPR.

| Vial | Strip | MEK Line 2 | ss-MAIB Line 3 | ss-methacrylate Line 4 | ss-CTA-HT3 |
|---|---|---|---|---|---|
| 1 | | 6.904158 | 1023.422 | 6486.679 | 482.9943 |
| 2 | 1 | 760.1124 | 511.7111 | 6486.679 | 241.4971 |
| 3 | | 1011.182 | 341.1407 | 6486.679 | 160.9981 |
| 4 | | 1165.686 | 236.1744 | 6486.679 | 111.4602 |
| 17 | | 6.904158 | 1023.422 | 6486.679 | 482.9943 |
| 18 | 3 | 760.1124 | 511.7111 | 6486.679 | 241.4971 |
| 19 | | 1011.182 | 341.1407 | 6486.679 | 160.9981 |
| 20 | | 1165.686 | 236.1744 | 6486.679 | 111.4602 |

TABLE 6 polymerization results with library 116964 AT 80° C.
Polymerization were all performed at 80° C., initial molar ratio
MAIB/CTA = 0.5, CTA-H-T-3 as a controlling agent with targeted
composition in molar percent of 50% N1, 35% P1 and 15% Q1.
Conversion was estimated by Raman Spectroscopy (measuring
the disappearance of vibration peak at 1600 cm$^{-1}$).

| Symyx Reference (A) | Process (G) | Mw targeted | Conversion (%) | Mw | PDi |
|---|---|---|---|---|---|
| 11695901 | 15 | 3,000 | 86 | 3800 | 1.33 |
| 11695902 | 15 | 6,000 | 87 | 6100 | 1.35 |
| 11695903 | 15 | 9,000 | 85 | 8400 | 1.37 |
| 11695904 | 15 | 13,000 | 80 | 10500 | 1.37 |
| 11695917 | 2 | 3,000 | 97 | 3740 | 1.29 |
| 11695918 | 2 | 6,000 | 97 | 6200 | 1.30 |
| 11695919 | 2 | 9,000 | 97 | 8200 | 1.31 |
| 11695920 | 2 | 13,000 | 95 | 11200 | 1.33 |

For more information regarding general synthesis utilizing a semicontinuous polymerization reactor (SCPPR), see for example, U.S. patent application Ser. No. 09/873,176, filed on Jun. 1, 2001 entitled "Parallel Semicontinuous or Continuous Reactors", the contents of which are incorporated herein by reference in their entirety.

Examples of Photoresists

The present invention is described below in more detail by examples. However, these examples should not be construed as limiting the present invention. In the examples, "part" refers to "part by weight" unless otherwise indicated.

Measurement and evaluation in the examples and comparative examples were carried out according to the following procedures.

Mw:

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene.

Examples to Prepare Control Polymers:

Example to Prepare control polymer R-1: To a two-liter-three-neck flask containing 200 g MEK and equipped with a reflux condenser and a mechanical stirrer was added constantly with stirring a solution containing 85.18 g P5, 20.2 g Q3, 94.62 g N2, 8.37 g MAIB, and 400 g MEK at 80° C. in 4 hour under nitrogen flow. The resultant polymerization solution was further heated at 80° C. for 2 hours, then was cooled to room temperature, precipitated slowly into 4000 g of isopropanol, washed with an additional 800 g of isopropanol for two times, and dried under vacuum at 60° C. for two days. 158 g of dry polymer (R-1) was isolated with an Mw=7300 g/mol, and a PDI=1.76, P5 (38.5%) Q3 (11.9%) N2 (49.6%) (by $^{13}$CNMR).

Example to Prepare control polymer R-2: To a two-liter-three-neck flask containing 19.2 g MEK and equipped with a reflux condenser and a mechanical stirrer was added constantly with stirring a solution containing 6.54 g P1, 2.47 g Q1, 6.98 g N1, 1.29 g MAIB, and 26 g MEK at 80° C. in 3 hour under nitrogen flow. Then 0.32 g MAIB in 0.32 g MEK was added, and the resultant polymerization solution was further heated at 80° C. for 2 hours. When being cooled to room temperature, the polymerization solution was precipitated slowly into 260 g of isopropanol, washed with an additional 52 g of isopropanol for two times, and dried under vacuum at 60° C. for two days. 13 g of dry polymer (R-2) was isolated with an Mw=6100 g/mol, and a PDI=2.01, P1 (35.5%) Q1 (15.6%) N1 (48.9%) (by $^{13}$CNMR).

Photo-Acid Generator (B)
B-1: triphenylsulfonium nonafluoro-n-butanesulfonate
Acid Diffusion Controller
C-1: trihydroxyethylamine
C-2: N-hydroxyethylpyperidine
Solvent
D-1: propylene glycol monomethyl ether acetate
D-2: ethyl lactate Measurement of Pattern Dimension:

Pattern dimension was measured by a scanning electron microscope (HITAHCHI, S-4200). For line and space pattern, the length at the middle of the line of a square cross-section of a line-and-space (1L1S) pattern was taken as the line dimension. For hole and space pattern, the length at the middle of the maximal square cross-section of a hole-and-space (1H1S) pattern was taken as the hole diameter.

Sensitivity:

A solution composition was applied to a silicon wafer with a 820 Å thickness ARC25 film (manufactured by Brewer Science Corp.) coated on the surface by spin coating and post-baked on a hot plate under the conditions shown in Table 8 to obtain a resist coating with a thickness of 0.34 μm. The coating was exposed to radiation through a mask pattern using an ArF excimer laser exposure apparatus (manufactured by Nikon Corp., lens numerical aperture: 0.55, wavelength: 193 nm). After performing PEB under the conditions shown in Table 8, the resist film was developed at 25° C. for 60 seconds in a 2.38 wt % tetramethylammonium hydroxide aqueous solution, washed with water, and dried to form a positive-tone resist pattern. For line and space patterns, an optimum dose capable of forming a 0.14 μm line-and-space pattern (1L1S) with a 1:1 line width (mask bias: 0 nm) was taken as sensitivity. For hole and space patterns, an optimum dose capable of forming 0.16 μm hole pattern (1H1S) with 0.20 μm hole and space pattern mask (mask bias: −40 nm) was taken as sensitivity.

Resolution:

Minimum dimensions of the resist pattern resolved at the optimum dose were taken as the resolution.

Exposure latitude (EL)

For line and space pattern, EL was defined as $(E_{-10}-E_{+10})/E_{op}$, wherein Eop represents the optimum dose (sensitivity), $E_{-10}$ and $E_{+10}$ represent the dose to form line-and-space pattern (1L1S) with a line width of 0.126 μm (=0.14×90%) and 0.154 μm (=0.14×110%) respectively. For hole-and-space pattern, EL was defined as $(E_{+10}-E_{-10})/Eop$, wherein $E_{op}$ represents the optimum dose (sensitivity), $E_{-10}$ and $E_{+10}$ represent the dose to form hole-and-space pattern (1H1S) with a hole diameter of 0.144 μm (=0.16×90%) and 0.176 μm (=0.16×110%) respectively.

Pattern Configuration:

For line and space pattern, the length of the bottom ($L_b$) and top ($L_a$) of a square cross-section of a line-and-space (1L1S) pattern with a line width of 0.0.14 μm was measured by a scanning electron microscope. For hole and space pattern, the diameter of the bottom ($L_b$) and top ($L_a$) of the maximal square cross-section of a hole-and-space (1H1S) pattern with a diameter of 0.16 μm was measured by a scanning electron microscope. The pattern configuration was judged by $L_a/L_b$ $L_a/L_b=1$ represents the ideal pattern shape. The closer to 1 $L_a/L_b$ is, the better the pattern shape is judged.

Photoresist Formulations:

Photoresist formulations are listed in Table 7.

Lithographic Performance Evaluation Conditions:

Lithographic performance evaluation conditions are listed in Table 8.

Results of Lithographic Performance Evaluation:

Results of lithographic performance evaluation are listed in Table 9.

TABLE 7

Unit in parenthesis (parts by weight)

| | Resin | Photo-acid generator | Acid diffusion controller | Solvent |
|---|---|---|---|---|
| Comparative Example 1 | R-1 (100) | B-1 (2) | C-1 (0.15) | D-1 (477) D-2 (204) |
| Example 1-1 | No11692711 (100) | B-1 (2) | C-1 (0.15) | D-1 (477) D-2 (204) |
| Example 1-2 | No11692711 (100) | B-1 (2) | C-1 (0.122) | D-1 (477) D-2 (204) |
| Comparative Example 2 | R-2 (100) | B-1 (2.5) | C-2 (0.212) | D-1 (646) D-2 (276) |
| Example 2-1 | No11694211 (100) | B-1 (2.5) | C-2 (0.212) | D-1 (646) D-2 (276) |
| Example 2-2 | No11694211 (100) | B-1 (2.5) | C-2 (0.108) | D-1 (646) D-2 (276) |
| Example 2-3 | No11342201 (100) | B-1 (2.5) | C-2 (0.212) | D-1 (646) D-2 (276) |
| Example 2-4 | No11342201 (100) | B-1 (2.5) | C-2 (0.152) | D-1 (646) D-2 (276) |

TABLE 8

| | Resist film thickness (μm) | Substrate | Pattern | PB Temp. (° C.) | PB Time (sec) | PEB Temp. (° C.) | PEB Time (sec) |
|---|---|---|---|---|---|---|---|
| Comparative Example 1 | 0.34 | ARC25 | Hole and space | 100 | 90 | 100 | 90 |
| Example 1-1 | 0.34 | ARC25 | Hole and space | 100 | 90 | 100 | 90 |
| Example 1-2 | 0.34 | ARC25 | Hole and space | 100 | 90 | 100 | 90 |
| Comparative Example 2 | 0.34 | ARC25 | Line and space | 130 | 90 | 130 | 90 |
| Example 2-1 | 0.34 | ARC25 | Line and space | 130 | 90 | 130 | 90 |
| Example 2-2 | 0.34 | ARC25 | Line and space | 130 | 90 | 130 | 90 |
| Example 2-3 | 0.34 | ARC25 | Line and space | 130 | 90 | 130 | 90 |

TABLE 8-continued

| | Resist film thickness (μm) | Substrate | Pattern | PB Temp. (°C.) | PB Time (sec) | PEB Temp. (°C.) | PEB Time (sec) |
|---|---|---|---|---|---|---|---|
| Example 2-4 | 0.34 | ARC25 | Line and space | 130 | 90 | 130 | 90 |

TABLE 9

| | Sensitivity (mJ/cm$^2$) | Resolution (μm) | Exposure Latitude (%) | Pattern configuration |
|---|---|---|---|---|
| Comparative Example 1 | 28 | 0.125 | 11 | 1.22 |
| Example 1-1 | 30 | 0.11 | 14.5 | 1.14 |
| Example 1-2 | 26 | 0.11 | 14 | 1.12 |
| Comparative Example 2 | 25 | 0.115 | 10.5 | 0.84 |
| Example 2-1 | 42 | 0.105 | 13 | 0.91 |
| Example 2-2 | 25 | 0.105 | 12.5 | 0.90 |
| Example 2-3 | 30 | 0.100 | 13.5 | 0.93 |
| Example 2-4 | 25 | 0.100 | 13.5 | 0.94 |

The radiation-sensitive resin compositions of the present invention exhibit excellent resolution when used as a chemically-amplified resist responsive to active radiation such as deep ultraviolet rays represented by an ArF excimer laser (wavelength: 193 nm). The resin compositions excel in pattern configuration and exposure latitude. The resin compositions can be suitably used for fabrication of integrated circuit devices which are expected to become more miniaturized.

Although the present invention has been described with reference to preferred embodiments, persons skilled in the art will recognize that changes may be made in form and detail without departing from the spirit and scope of the invention.

We claim:

1. A photoresist composition comprising a photo-acid generator and a polymeric resin comprising the formula:

[A]$_x$[B]$_y$[C]$_z$ wherein A, B and C are each individually one of

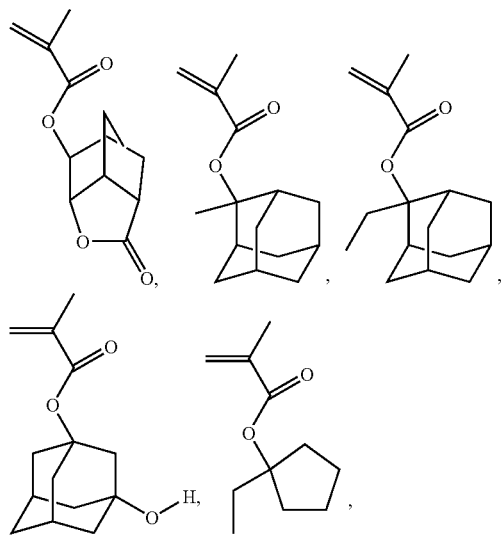

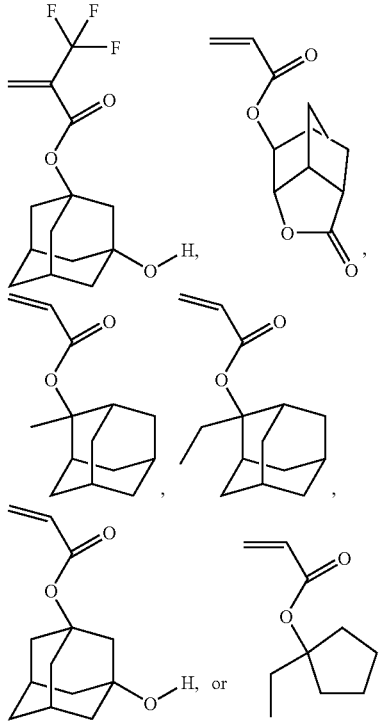

wherein x is between about 0 and about 200 inclusive, y is between about 1 and about 200 inclusive and z is between about 1 and about 200 inclusive, provided B≠C wherein the polymer is prepared by a living free radical process (LFRP) in the presence of a chain transfer agent (CTA) having the formula:

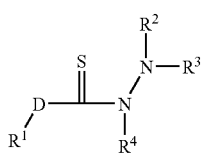

wherein R$^1$ is any group that can be expelled as its free radical form in an addition-fragmentation reaction;

R$^2$ and R$^3$ are each independently selected from the group consisting of hydrogen, hydrocarbyl, substituted hydrocarbyl, heteroatom-containing hydrocarbyl, and substituted heteroatom-containing hydrocarbyl, and combinations thereof, and optionally R$^2$ and R$^3$ together to form a double bond optionally substituted alkenyl moiety;

R$^4$ is selected from the group consisting of hydrogen, hydrocarbyl, substituted hydrocarbyl, heteroatom-containing hydrocarbyl, and substituted heteroatom-containing hydrocarbyl, and combinations thereof and optionally, $R^4$ combines with $R^2$ and/or $R^3$ to form a ring structure, with said ring having from 3 to 50 non-hydrogen atoms; and D is either sulfur, selenium or tellurium.

2. The photoresist composition of claim 1, wherein x is at least 1.

3. The photoresist composition of claim 1, wherein the polydispersity index is less than 1.7.

4. The photoresist composition of claim 1, wherein the polydispersity index is between about 1.2 to about 1.4.

5. The photoresist composition of claim 1, wherein the $M_w$ is between about 3,000 and about 20,000.

6. The photoresist composition of claim 1, wherein the $M_w$ is between about 3,000 and about 10,000.

7. The photoresist composition of any one of claims 1-6, wherein A, B and C are each individually one of

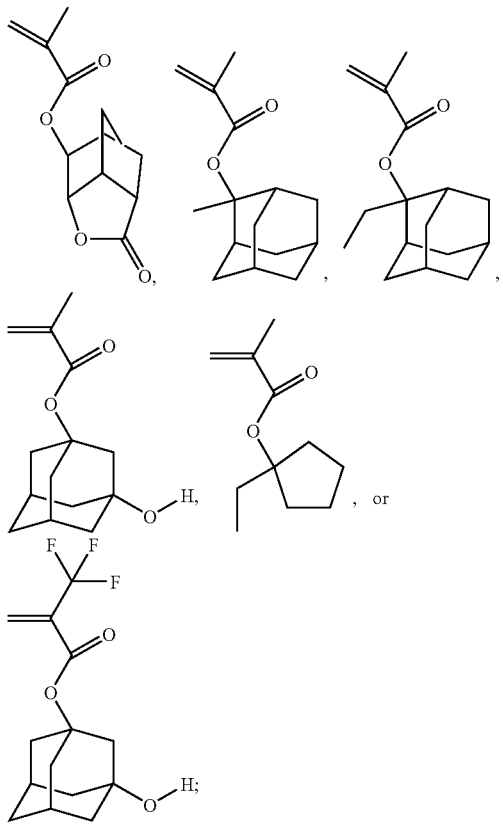

and
x is at least 1.

8. The photoresist composition of any one of claims 1-6, wherein A, B and C are each individually one of

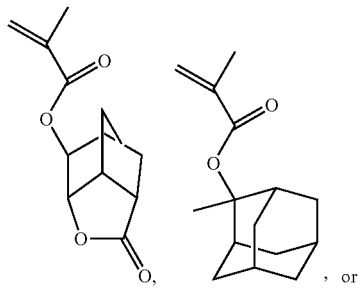

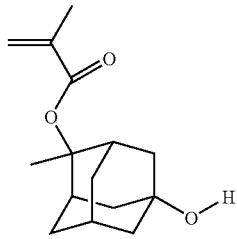

and x is at least one.

9. The photoresist composition of claim 8, wherein the formula is

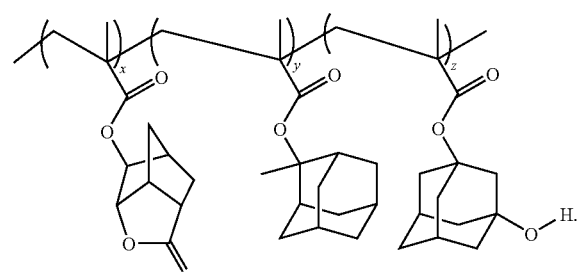

10. The photoresist composition of claim 9, wherein the $M_w$ is between about 3,000 and 10,000.

11. The photoresist composition of claim 9, wherein the polydispersity index is about 1.3.

12. The photoresist composition of any one of claim 1-6, wherein A, B and C are each individually one of

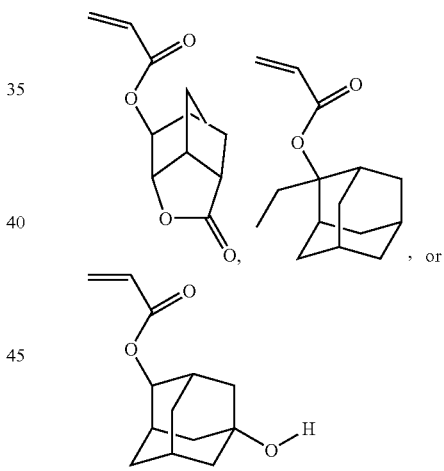

and x is at least one.

13. The photoresist composition of claim 12, wherein the formula is

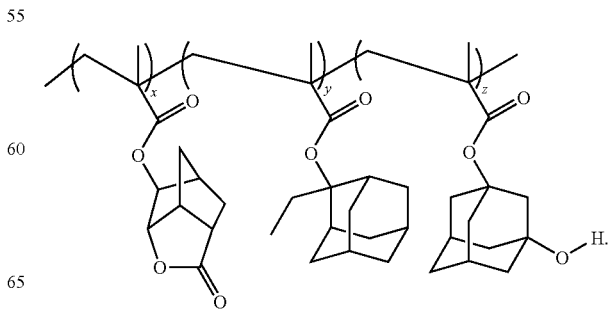

14. The photoresist composition of claim 13, wherein the $M_w$ is between about 3,000 to about 12,000.

15. The photoresist composition of claim 13, wherein the polydispersity index is between about 1.1 and about 1.2.

16. The photoresist composition of any one of claim 1-6, wherein A, B and C are each individually one of

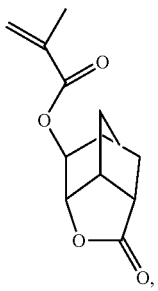 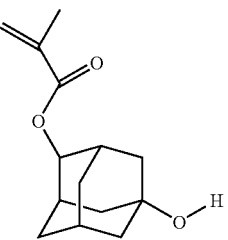

, or

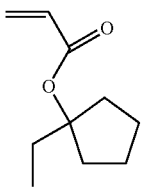

and x is at least 1.

17. The photoresist composition of claim 16, wherein the formula is

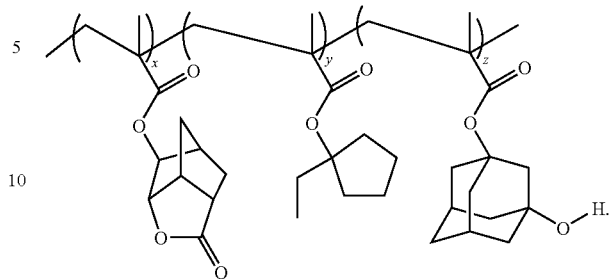

18. The photoresist composition of claim 17, wherein the $M_w$ is between about 3,000 to about 12,000.

19. The photoresist composition of claim 17, wherein the polydispersity index is between about 1.1 and about 1.2.

20. The photoresist composition of any one of claim 1-6, wherein the terminal end position includes a thiocarbonylthio moiety.

21. The photoresist composition of any one of claim 1-6, wherein the terminal end position includes a termination group having the formula

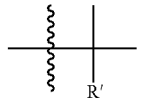

wherein R' is CN or COOMe.

* * * * *